(12) United States Patent
Li et al.

(10) Patent No.: US 12,193,286 B2
(45) Date of Patent: Jan. 7, 2025

(54) DISPLAY PANEL AND DISPLAY DEVICE

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventors: Yue Li, Shanghai (CN); Xingyao Zhou, Shanghai (CN); Zhuan Gao, Shanghai (CN); Qingxia Wang, Shanghai (CN); Yuantao Wu, Shanghai (CN)

(73) Assignees: Wuhan Tianma Micro-Electronics Co., Ltd., Wuhan (CN); Wuhan Tianma MicroElectronics Co., Ltd. Shanghai Branch, Shanghai (CN)

( * ) Notice: Subject to any disclaimer, the term of this patent is extended or adjusted under 35 U.S.C. 154(b) by 540 days.

(21) Appl. No.: 17/587,884

(22) Filed: Jan. 28, 2022

(65) Prior Publication Data
US 2023/0141363 A1    May 11, 2023

(30) Foreign Application Priority Data

Nov. 10, 2021    (CN) .......................... 202111327570.8

(51) Int. Cl.
   *H10K 59/131*    (2023.01)
   *G09G 3/32*      (2016.01)
   *H10K 50/844*    (2023.01)
   *H10K 77/10*     (2023.01)

(52) U.S. Cl.
   CPC ......... *H10K 59/131* (2023.02); *H10K 50/844* (2023.02); *H10K 77/10* (2023.02); *G09G 3/32* (2013.01); *G09G 2320/0223* (2013.01)

(58) Field of Classification Search
   CPC .... H10K 50/844; H10K 77/10; H10K 59/131; G09G 2320/0223; G09G 3/32
   See application file for complete search history.

(56) References Cited

U.S. PATENT DOCUMENTS

| | | | | |
|---|---|---|---|---|
| 9,311,855 | B2* | 4/2016 | Jung | G06F 3/0412 |
| 9,349,322 | B2* | 5/2016 | Kim | G09G 3/3233 |
| 9,940,866 | B2* | 4/2018 | Lin | G09G 3/2092 |
| 9,954,049 | B2* | 4/2018 | Im | H10K 50/844 |
| 9,965,995 | B2* | 5/2018 | Chen | G09G 3/20 |
| 11,069,766 | B2* | 7/2021 | Tao | G09G 3/3233 |
| 11,322,574 | B2* | 5/2022 | Kawamura | G09G 3/3258 |
| 11,508,798 | B2* | 11/2022 | Saitoh | H05B 33/22 |
| 2019/0259349 | A1* | 8/2019 | Kaise | G09G 3/3688 |
| 2024/0090281 | A1* | 3/2024 | Yamada | H10K 59/131 |

FOREIGN PATENT DOCUMENTS

| | | |
|---|---|---|
| CN | 109712558 A | 5/2019 |
| CN | 112086065 A | 12/2020 |

* cited by examiner

*Primary Examiner* — Vinh T Lam
(74) *Attorney, Agent, or Firm* — Anova Law Group, PLLC

(57) ABSTRACT

Display panel and display device are provided. The display panel includes a display area and a non-display area surrounding the display area. The display area includes a plurality of scan lines extending in a first direction and a plurality of data lines extending in a second direction, the first direction intersects the second direction. The non-display area includes a bonding area. The bonding area includes a plurality of pads arranged in a third direction. A direction perpendicular to the third direction is a fourth direction. An angle formed by the second direction and the fourth direction is θ, and 0°<θ<90°.

20 Claims, 19 Drawing Sheets

DISPLAY PANEL AND DISPLAY DEVICE

CROSS-REFERENCE TO RELATED APPLICATION

This application claims priority of Chinese Patent Application No. 202111327570.8, filed on Nov. 10, 2021, the entire contents of which are hereby incorporated by reference.

FIELD OF THE DISCLOSURE

The present disclosure generally relates to the field of display technology and, more particularly, relates to a display panel and a display device.

BACKGROUND

With a continuous development of display technology and diverse needs of users for appearances of display devices, relevant display panel manufacturers have begun to design and produce irregularly shaped display panels, such as circular display panels that can be applied to watches or wearable mobile phones.

However, current irregularly shaped display panels and display devices still need to be improved.

BRIEF SUMMARY OF THE DISCLOSURE

One aspect of the present disclosure provides a display panel. The display panel includes a display area and a non-display area surrounding the display area. The display area includes a plurality of scan lines extending in a first direction and a plurality of data lines extending in a second direction, the first direction intersects the second direction. The non-display area includes a bonding area. The bonding area includes a plurality of pads arranged in a third direction. A direction perpendicular to the third direction is a fourth direction. An angle formed by the second direction and the fourth direction is θ, and 0°<θ<90°.

Another aspect of the present disclosure provides a display device. The display device includes a display panel. The display panel includes a display area and a non-display area surrounding the display area. The display area includes a plurality of scan lines extending in a first direction and a plurality of data lines extending in a second direction, the first direction intersects the second direction. The non-display area includes a bonding area. The bonding area includes a plurality of pads arranged in a third direction. A direction perpendicular to the third direction is a fourth direction. An angle formed by the second direction and the fourth direction is θ, and 0°<θ<90°.

Other aspects of the present disclosure can be understood by a person skilled in the art in light of the description, the claims, and the drawings of the present disclosure.

EF DESCRIPTION OF THE DRAWINGS

By reading a following detailed description of non-limiting embodiments with reference to accompanying drawings, other features, purposes, and advantages of the present disclosure will become more apparent. Same or similar reference signs in the accompanying drawings indicate same or similar features. The accompanying drawings are not drawn according to actual scales.

DETAILED DESCRIPTION

Features and exemplary embodiments of various aspects of the present disclosure will be described in detail below. To make objectives, technical solutions, and advantages of the present disclosure clearer, the following further describes the present disclosure in detail with reference to accompanying drawings and specific embodiments. The specific embodiments described herein are only configured to explain the present disclosure, and not configured to limit the present disclosure. For a person skilled in the art, the present disclosure can be implemented without some of specific details. The following description of the embodiments is only to provide a better understanding of the present disclosure by showing examples of the present disclosure.

It should be noted that in the present disclosure, relational terms such as first and second are only used to distinguish one entity or operation from another entity or operation, and do not necessarily require or imply that entities or operations have any such actual relationship or order. In addition, terms "include", "comprise" or any other variations thereof are intended to cover a non-exclusive inclusion, such that a process, an apparatus, an article, or a device that includes a series of elements includes not only those elements, but also other elements that are not explicitly listed or inherent to the process, the apparatus, the article, or the device. Without more restrictions, an element defined by an expression "including a . . . " does not exclude an existence of other identical elements in the process, the apparatus, the article, or the device that includes the elements.

When describing a structure of a component, if a layer or area is referred to as being "on" or "above" another layer or area, the layer or area may be directly on the other layer or area, or intervening layers or areas may be present therebetween. Further if the component is turned over, the layer or area will be "below" or "beneath" another layer or area.

In the embodiments of the present disclosure, a term "electrical connection" may mean that two components are directly electrically connected or may mean that two components are electrically connected via one or more other components.

It is apparent to a person skilled in the art that various modifications and changes can be made in the present disclosure without departing from the spirit or scope of the present disclosure. Therefore, the present disclosure intends to cover amendments and changes of the present disclosure that fall within the scope of corresponding claims (claimed technical solutions) and equivalents thereof. It should be noted that the implementations provided in the embodiments of the present disclosure can be combined with each other if there is no contradiction.

Figure 1:
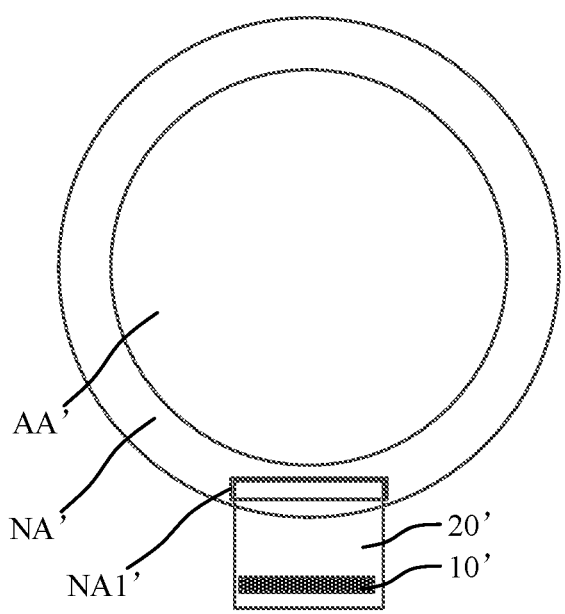
FIG. 1 illustrates a schematic diagram of a display panel.

With a continuous development of display technology and diverse needs of users for appearances of display devices, relevant display panel manufacturers have begun to design and produce irregularly shaped display panels, such as circular display panels that can be applied to watches or wearable mobile phones. As shown in FIG. 1, a display panel includes a display area AA' and a non-display area NA'. To narrow the non-display area NA' of the circular display panel 100', Chip on Film (COF) technology is often applied in related technologies. That is, a driver IC 10' is integrated into a flexible printed circuit (FPC) 20' to form a COF flexible circuit board. The COF flexible circuit board is bent to a back of the display panel 100' to save a space of a lower frame.

In related technologies, a bonding area NA1' is disposed at a lower frame, and the FPC 20' is bound to the bonding area NA1'. However, when a user has space constraints on the lower frame or needs to dispose other functional modules on the lower frame, the bonding area NA1' cannot be disposed on the lower frame.

In view of the above limitation, the embodiments of the present disclosure provide a display panel and a display device, which can meet diverse needs of users.

Figure 2:
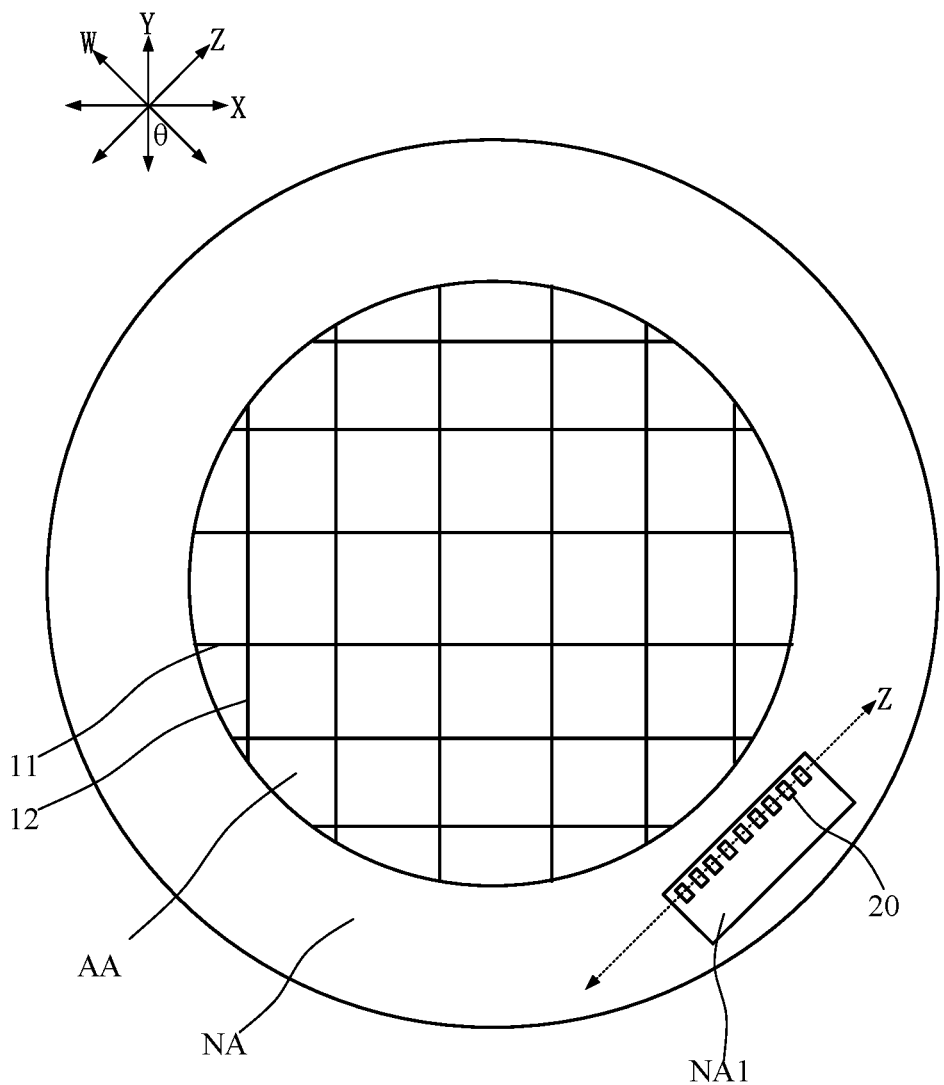
FIG. 2 illustrates a schematic diagram of a display panel provided by an embodiment of the present disclosure.

As shown in FIG. 2, in one embodiment, a display panel 100 includes a display area AA and a non-display area NA surrounding the display area AA. Different from a conventional rectangular display panel, the display panel 100 may have a irregular shape. An outer contour of the display panel 100 includes arc-shaped line segments. Exemplarily, a shape of the display area AA of the display panel may include a circle, to be further applied to wearable devices such as watches. In some other embodiments, the display panel 100 may also be oval or polygonal to fully meet diverse needs of users for different display panel shapes. The present disclosure does not limit a specific shape of the display panel 100. In the embodiments of the present disclosure, the display panel 100 is take as a circular as an example, which is not intended to limit the present disclosure.

Referring to FIG. 2, the display area AA may be disposed with scan lines 11 and data lines 12. The non-display area NA may include a bonding area NA1. The bonding area NA1 may be disposed with a plurality of pads 20.

A plurality of scan lines 11 may extend along a first direction X and be spaced apart in a second direction Y. A plurality of data lines 12 may extend along the second direction Y and be distributed at intervals in the first direction X. The first direction X intersects the second direction Y. Exemplarily, the first direction X may be perpendicular to the second direction Y, the first direction X may be a row direction, and the second direction Y may be a column direction. The plurality of pads 20 are disposed along a third direction Z. A direction perpendicular to the third direction Z is a fourth direction W. The second direction Y and the fourth direction W form an angle θ, and 0°<θ<90°. That is, in the embodiments of the present disclosure, the bonding area NA1 is no longer disposed on a lower or upper frame of the display panel but is disposed away from the lower or upper frame of the display panel, so that the bonding area NA1 is designed with bias. Compared with FIG. 1 where the bonding area NA1' is disposed on the lower frame of the display panel, in the embodiment, the bonding area NA1 is rotated by an angle θ, and the bonding area NA1 is disposed on a right or left frame.

The third direction Z is different from the first direction X, and the third direction Z is different from the second direction Y. The first direction X, the second direction Y, the third direction Z, and the fourth direction W are all directions parallel to a plane where the display panel 100 is located.

It should be noted that numbers and sizes of the plurality of scan lines 11, the plurality of data lines 12, and the plurality of pads 20 in FIG. 2 do not represent actual numbers and sizes but are merely illustrative.

In the embodiment, by setting the bonding area NA1 away from the lower or upper frame of the display panel, a space of the lower or upper frame of the display panel can be saved, thereby satisfying a user's space restriction requirement for the lower frame. In addition, other functional modules can be set at the lower frame or upper frame to meet diverse needs of users.

Figure 3:
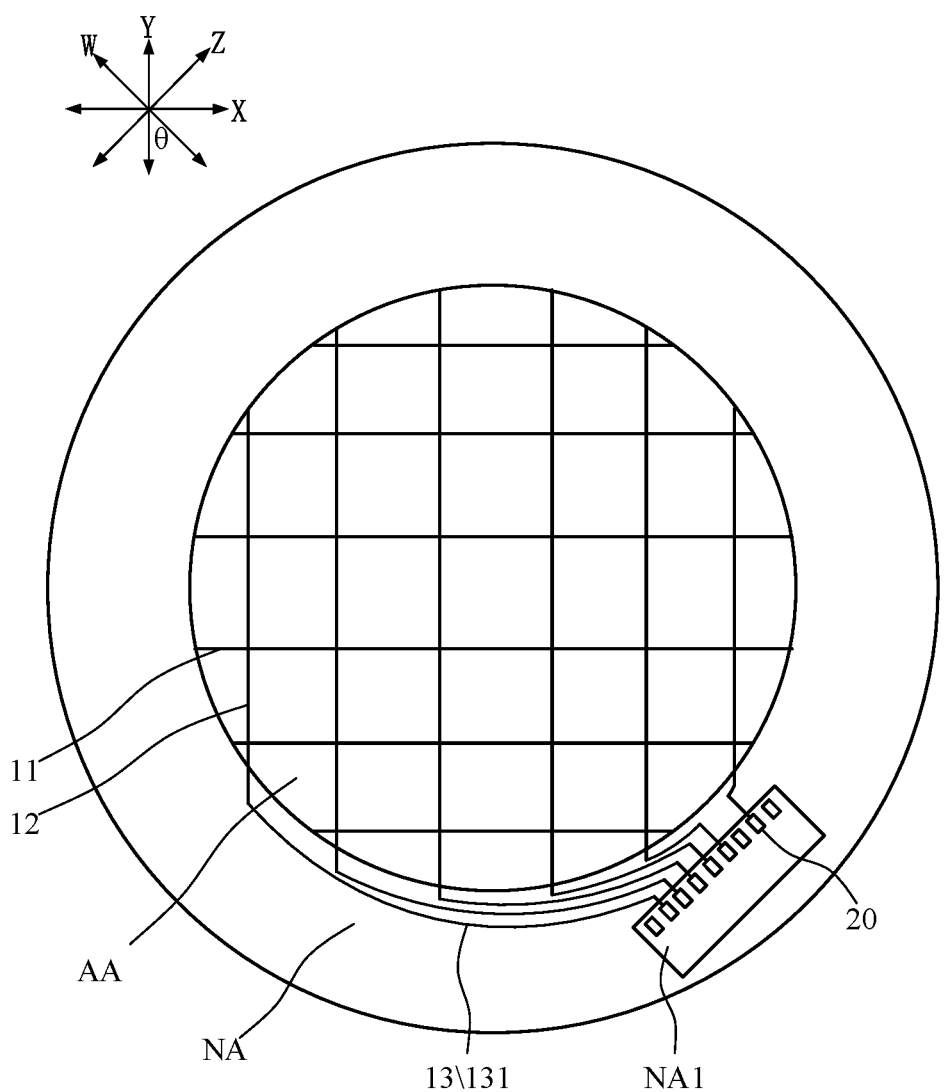
FIG. 3 illustrates a schematic diagram of a display panel provided by another embodiment of the present disclosure.

Exemplarily, the driver IC can be integrated on an FPC. The FPC can be bound to the plurality of pads 20 of the bonding area NA1. The driver IC can provide data signals to the plurality of data lines 12 to control the display panel 100 for display. Exemplarily, as shown in FIG. 3, fan-out wirings 13 may be disposed to be electrically connected between the plurality of pads 20 and the plurality of data lines 12, so that the driver IC can transmit data signals to the plurality of data lines 12 through the fan-out wirings 13. If a bias of the bonding area NA1 is larger, that is, the angle θ formed by the second direction Y and the fourth direction W is larger, a wiring length of a fan-out wiring 13 needs to be set to be longer. If the wiring length of the fan-out wiring 13 is longer, to accommodate more fan-out wirings 13, a size of the non-display area NA needs to be increased, which is not conducive to achieving a narrow frame. A longer fan-out wiring 13 also has a long signal transmission delay, which is not conducive to a timeliness of signal transmission.

In some optional embodiments, the angle θ formed by the second direction Y and the fourth direction W may satisfy 0°<θ≤45° to prevent the bonding area NA1 from being biased too much, thereby avoiding a long wiring length of the fan-out wiring 13, which is conducive to realize a narrow frame and a timeliness of signal transmission.

Exemplarily, the angle θ formed by the second direction Y and the fourth direction W may be 5°, 15°, 25°, 35°, 45°, and so on.

Figure 4:
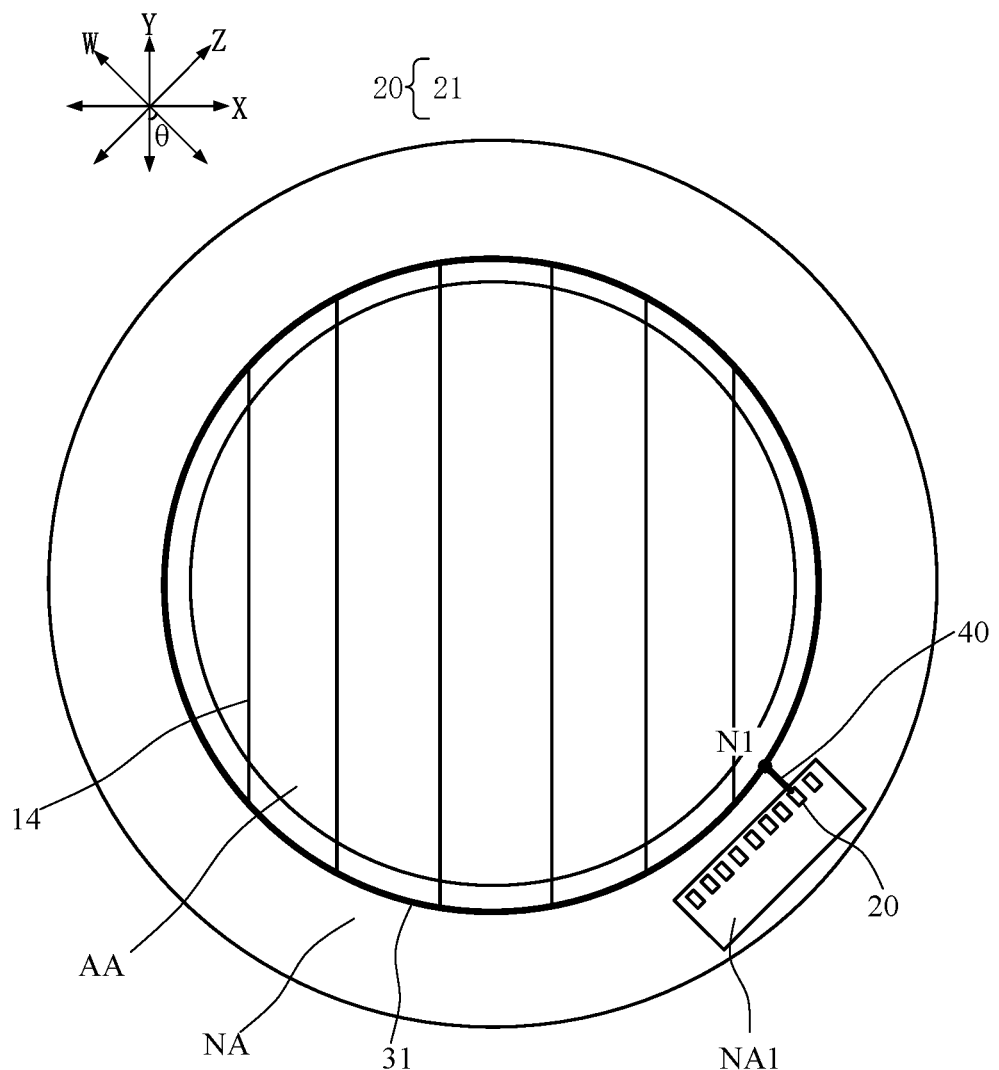
FIGS. 4-6 illustrate schematic diagrams of display panels provided by other embodiments of the present disclosure.

In some optional embodiments, as shown in FIG. 4, the non-display area NA may include a first power bus 31 at least partially surrounding the display area AA. The pads 20 may include at least one first conductive pad 21. The first power bus 31 may include first connection nodes N1. The display area NA may also include a bus connection portion 40. The first power bus 31 is connected to a first conductive pad 21 at the first connection node N1 through the bus connection portion 40. That is, the bus connection portion 40 is connected between the first connection node N1 and the first conductive pad 21. A voltage signal on the first conductive pad 21 is transmitted to the first connection node N1 through the bus connection portion 40.

Number of the first connection node N1 is at least one. The number of the first connection node N1 may be two or more. Optionally, as shown in FIG. 4, taking the number of the first connection node N1 as one as an example, the bus connection portion 40 may extend along the fourth direction W. Therefore, an extending direction of the bus connection portion 40 is perpendicular to the third direction Z, and the bus connection portion 40 is a shortest path between the first power bus 31 and the pads 20, so that a wiring length of the bus connection portion 40 can be reduced, thereby reducing a voltage drop of the bus connection portion 40.

Figure 5:
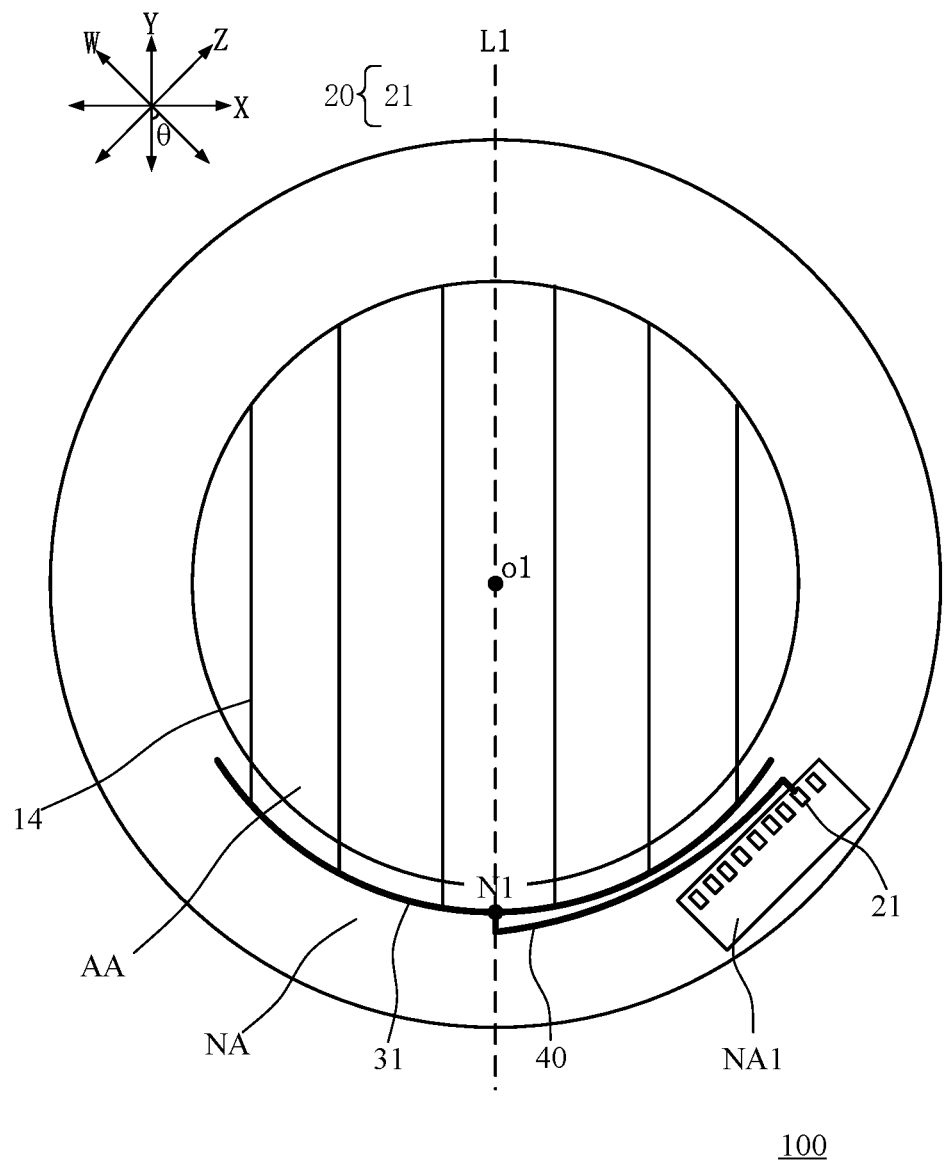

Optionally, as shown in FIG. 5, taking number of the first connection node N1 as one as an example, the first connection node N1 may be located at approximately six o'clock on the display panel. To better understand a position of the first connection point N1, a first straight line L1 and a center point O1 of the display area AA are introduced herein. The first straight line L1 passes through the center point O1 of the display area AA and extends along the second direction Y. Exemplarily, the first straight line L1 may pass through the first connection node N1, or a vertical distance between the first connection node N1 and the first straight line L1 is relatively short. Therefore, a voltage signal on the first conductive pad 21 can be transmitted from a center of the display area AA to two sides of the display area AA in the first direction X. The voltage signal on the first conductive pad 21 first reaches the central area of the display area, and reaches areas on two sides of the display area in the first direction X. Therefore, the first conductive pad 21 can be ensured to supply power to the display area uniformly. A problem of uneven display caused by the voltage signal on the first conductive pad 21 starting to supply power from a side area of the display area in the first direction X can be avoided.

Exemplarily, the display area AA of the display panel 100 may be disposed with a plurality of voltage signal transmission lines 14. The plurality of voltage signal transmission lines 14 may extend along the second direction Y. The plurality of voltage signal transmission lines 14 are electrically connected to the first power bus 31. The first power bus 31 can be used to transmit positive voltage signals to the plurality of voltage signal transmission lines 14, and the plurality of voltage signal transmission lines 14 can also be referred to as PVDD lines.

For example, the first power bus 31 may be electrically connected to any end of a voltage signal transmission line 14. For another example, the first power bus 31 may be electrically connected to two ends of the voltage signal transmission line 14. Exemplarily, as shown in FIG. 4, the first power bus 31 may be a closed wiring surrounding the display area AA, or as shown in FIG. 5, the first power bus 31 may also be a non-closed wiring only partially surrounding the display area AA.

Figure 6:
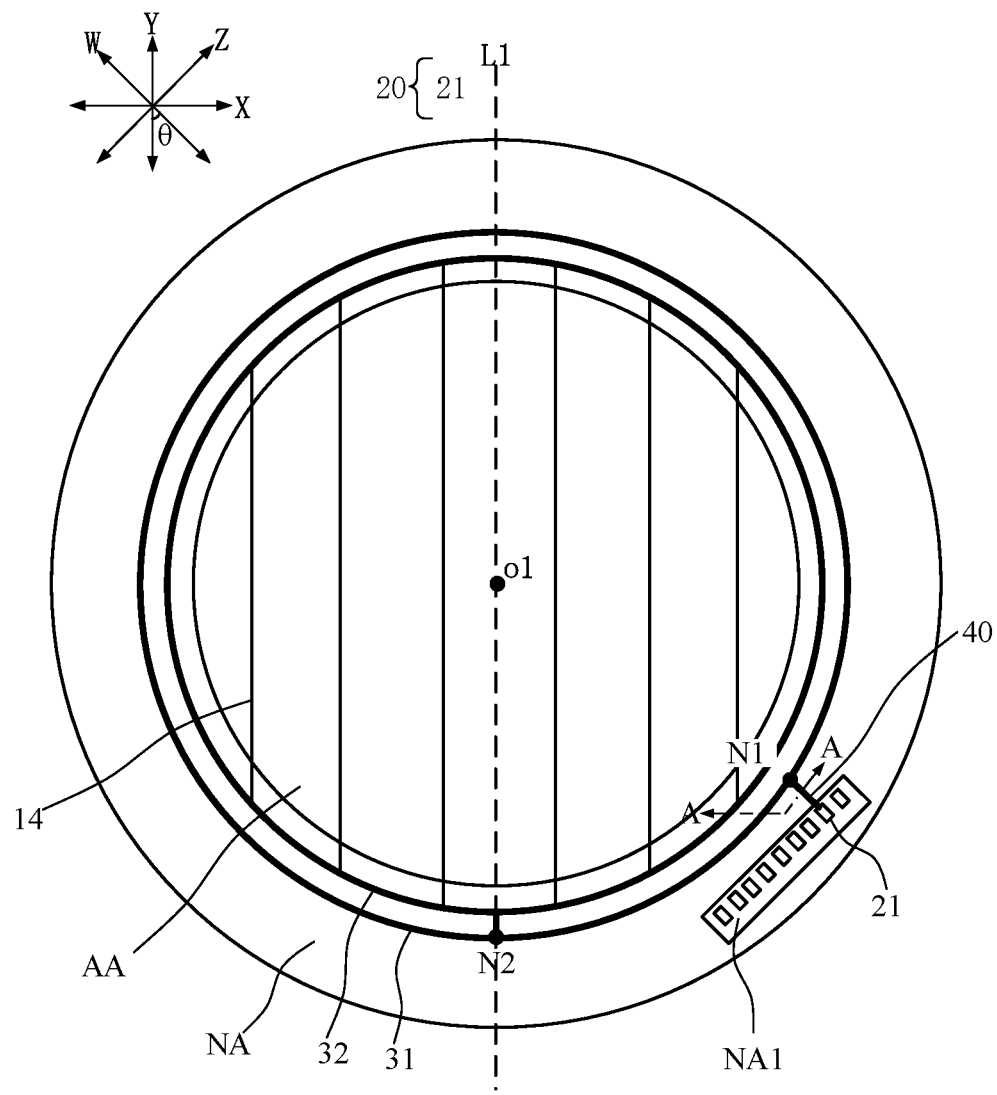

In some optional embodiments, as shown in FIG. 6, the non-display area NA may also be disposed with a second power bus 32. The second power bus 32 at least partially surrounds the display area AA. The second power bus 32 may be located between the first power bus 31 and the display area AA. The second power bus 32 is electrically connected to the first power bus 31.

Exemplarily, at least part of the plurality of voltage signal transmission lines 14 in the display area AA may be electrically connected to the second power bus 32. The voltage signal on the first conductive pad 21 may be sequentially transmitted to the display area AA through the bus connection portion 40, the first power bus 31, and the second power bus 32.

In the embodiment, by providing the first power bus 31 and the second power bus 32 that are electrically connected, the first power bus 31 and the second power bus 32 can be regarded as being arranged in parallel. A voltage drop between the first power bus 31 and the second power bus 32 is reduced, and a display uniformity is improved.

Exemplarily, the first power bus 31 and the second power bus 32 may be disposed on a same film layer. Materials of the first power bus 31 and the second power bus 32 may also be same. Therefore, the first power bus 31 and the second power bus 32 can be simultaneously formed in a same process step. Optionally, the first power bus 31, the second power bus 32, and the bus connection portion 40 may be disposed on a same film layer, and materials of the first power bus 31, the second power bus 32 and the bus connection portion 40 may also be same. Therefore, the first power bus 31, the second power bus 32, and the bus connection portion 40 can be simultaneously formed in a same process step.

Figure 7:
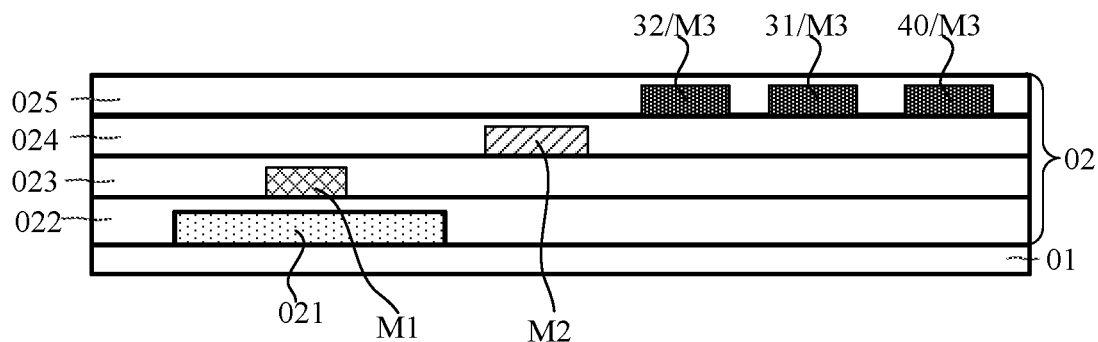
FIG. 7 illustrates a schematic diagram of a cross-section along a A-A direction in FIG. 6.

Exemplarily, as shown in FIG. 7, the display panel 100 may include a substrate 01 and a driving device layer 02 on a side of the substrate 01. The driving device layer 02 may include a semiconductor layer 021, a first metal layer M1, a second metal layer M2, and a third metal layer M3 that are sequentially stacked in a direction away from the substrate 01. A gate insulating layer 022 can be disposed between the first metal layer M1 and the semiconductor layer 021. A capacitor insulating layer 023 can be disposed between the second metal layer M2 and the first metal layer M1. An interlayer dielectric layer 025 can be disposed between the third metal layer M3 and the second metal layer M2. The interlayer dielectric layer 025 may be disposed to cover the third metal layer M3. The first power bus 31, the second power bus 32 and the bus connection portion 40 may all be disposed on the third metal layer M3. The scan lines 11 may be disposed in the first metal layer M1. The plurality of data lines 12 and the voltage signal transmission lines 14 may also be disposed on the third metal layer M3. The second metal layer M2 can be used to dispose a plate of capacitors.

Exemplarily, the second power bus 32 may be electrically connected to any end of a voltage signal transmission line 14. For another example, the second power bus 32 may be electrically connected to two ends of the voltage signal transmission line 14. Exemplarily, the second power bus 32 may be a closed wiring surrounding the display area AA, or the second power bus 32 may also be a non-closed wiring only partially surrounding the display area AA.

Exemplarily, the first power bus 31 may include a second connection node N2 different from the first connection node N1. The second power bus 32 may be in contact with the first power bus 31 at the second connection node N2. When the first power bus 31 includes the second connection node N2, the first power bus 31 may only include a wiring segment between the first connection node N1 and the second connection node N2, so that the first power bus 31 is a non-closed wiring that only partially surrounds the display area AA.

Taking the number of the second connection node N2 as one as an example, the second connection node N2 may be at approximately six o'clock on the display panel. To better understand a position of the second connecting node N2, taking an introduction of the first straight line L1 and a central point O1 of the display area AA as an example, the first straight line L1 passes through the central point O1 of the display area AA and extends along the second direction Y. Exemplarily, the first straight line L1 may pass through the second connection node N2, or a vertical distance between the second connection node N2 and the first straight line L1 is relatively short. Therefore, voltage signals on the first conductive pads 21 can be transmitted from the center of the display area AA to two sides of the display area AA in the first direction X. That is, a voltage signal on the first conductive pad 21 first reaches a central area of the display area, and then reaches areas on two sides of the display area in the first direction X. Therefore, the first conductive pads 21 can be ensured to supply power to the display area uniformly. A problem of uneven display caused by the voltage signal on the first conductive pads 21 starting to supply power from a side area of the display area in the first direction X can be avoided.

Number of second connection nodes N2 can also be two or more, and positions of the plurality of second connection nodes N2 can be set reasonably to ensure that a voltage signal on the first conductive pad 21 can be uniformly transmitted to the display area.

In some optional embodiments, referring to FIG. 6, the second connection node N2 may be on a side of the first power bus 31 close to the bonding area NA1 along the second direction Y. For example, the bonding area NA1 can be disposed at a lower right of the display panel. The second connection node N2 can be disposed directly below the display area AA. Since the second connection node N2 is disposed close to the bonding area NA1, a voltage signal on first conductive pad 21 in the bonding area NA1 can reach the second power bus along a shorter path and can reduce a voltage drop caused by the first power bus 31.

Figure 8:
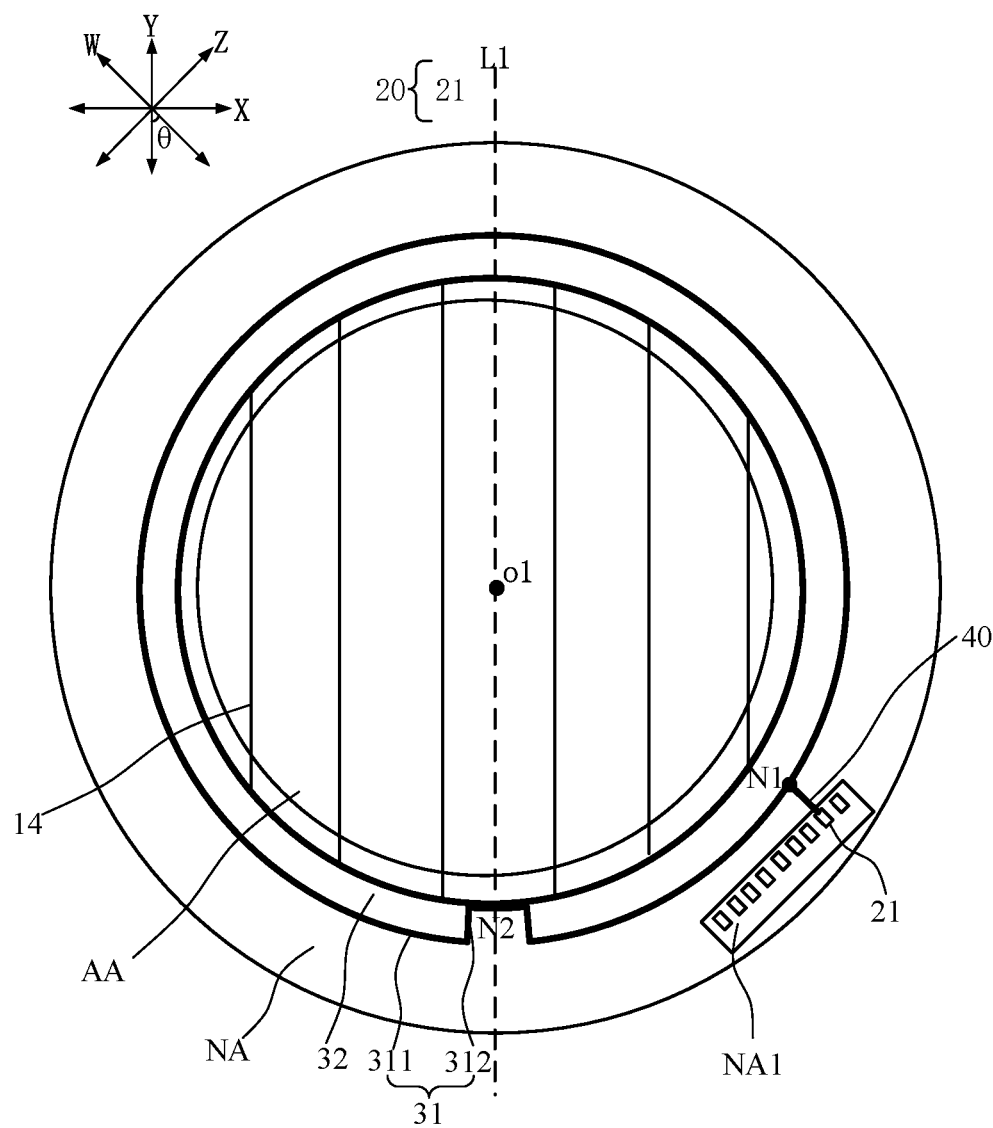
FIGS. 8-9 illustrate schematic diagrams of display panels provided by other embodiments of the present disclosure.

In some optional embodiments, as shown in FIG. 8, the first power bus 31 may be recessed toward the display area AA at the second node N2. The second connection node N2 has a certain length, and the first power bus 31 is in contact with the second power bus 32 at the second connection node N2, so that a width of the contact overlap between the first power bus 31 and the second power bus 32 at the second connection node N2 is greater than a width of any other area. Compared with the first power bus 31 and the second power bus 32 being electrically connected or overlapped through a via, in one embodiment of the present disclosure, an area where the first power bus 31 and the second power bus 32 are connected in parallel can be wider, so that a voltage drop can be better reduced.

Exemplarily, the first power bus 31 may include a first subsection 311 and a second subsection 312 that are connected to each other. The first subsection 311 extends along a direction surrounding the display area AA. An extending direction of the second subsection 312 may cross the first subsection 311. The second subsection 312 may be on a side of the first subsection 311 close to the display area AA. The second subsection 312 is connected between the first subsection 311 and the second connection node N2. The first subsection 311, the second subsection 312, the second connection node N2, and the second power bus 32 may be disposed on a same film layer.

Exemplarily, when the first power bus 31 may be recessed toward the display area AA at the second node N2, the first straight line L1 may pass through the second connection node N2.

Figure 9:
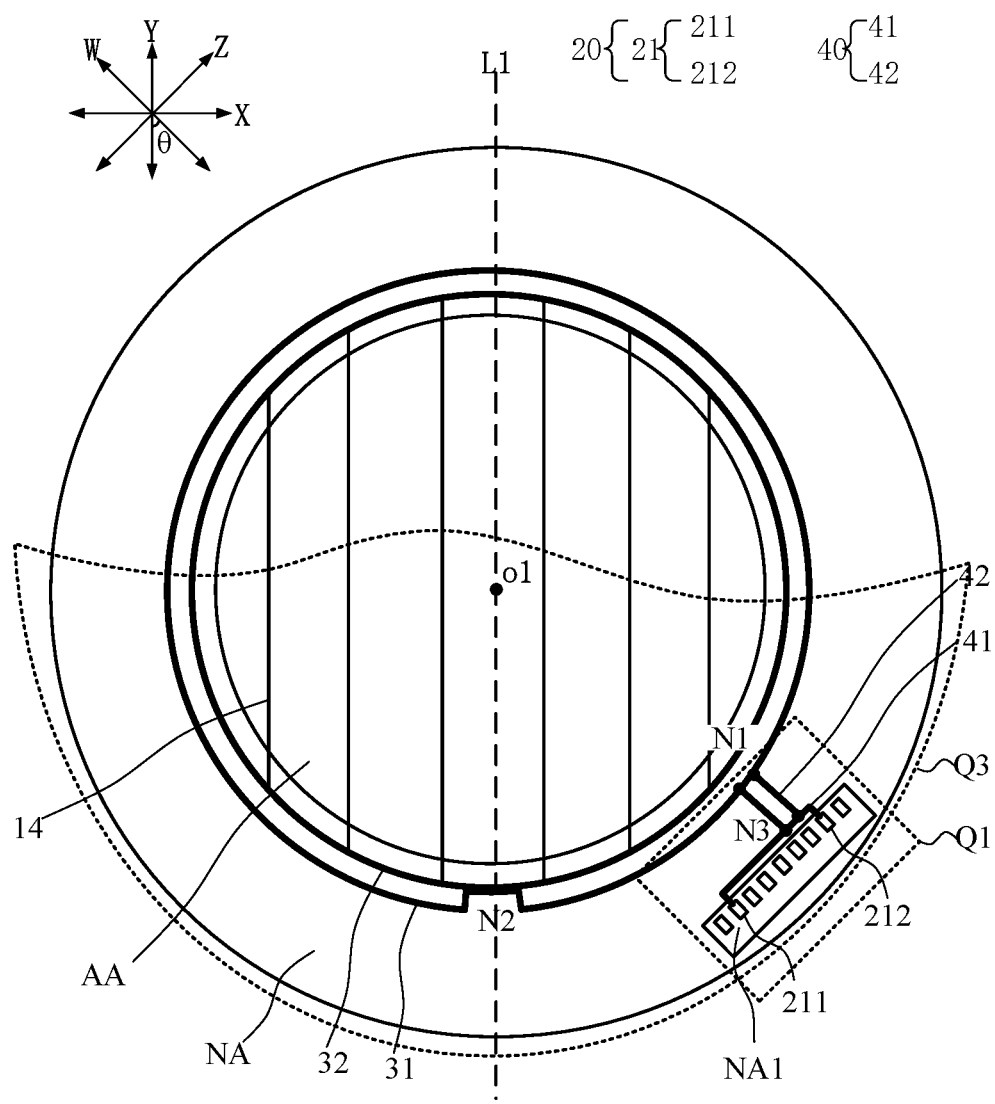

In some optional embodiments, as shown in FIG. 9, the bus connection portion 40 may include a first sub-connection portion 41 and at least one second sub-connection portion 42. The first sub-connection portion 41 extends along the third direction Z, and the at least one second sub-connection portion 42 extends along the fourth direction W. Two ends of the first sub-connection portion 41 are respectively connected to first conductive pads 21. Number of the first conductive pads 21 is at least two, and the two ends of the first sub-connection portion 41 can be respectively connected to one first conductive pad 21. One end of a second sub-connection portion 42 is connected to a third connection node N3 between the two ends of the first sub-connection portion 41, and another end of the second sub-connection portion 42 is connected to the first connection node N1. In addition, when number of the second sub-connection portion 42 is a plurality, number of third connection nodes N3 between the two ends of the first sub-connection portion 41 may also be a plurality. The plurality of second sub-connection portion 42 may be in one-to-one correspondence with the plurality of third connection nodes N3.

Number of the second sub-connection portions 42 may be one or more. If number of the second sub-connection portions 42 is one, a line width of the second sub-connection portion 42 can be set relatively wide. For example, the line width of the second sub-connection portion 42 may be greater than a line width of a fan-out wiring. Optionally, the line width of the second sub-connection portion 42 is greater than a line width of a voltage signal transmission line 14. The second sub-connection portion 42 includes hollow structures. A plurality of hollow structures may be disposed along an extension direction of the fourth direction W. Optionally, the second sub-connection portion 42 is disposed with groove structures along an opposite edge of the third direction Z to prevent water and oxygen from intruding. If number of the second sub-connection portions 42 is a plurality, other lines may be disposed between adjacent second sub-connection portions 42. For example, a control signal line of a switch can be disposed between adjacent second sub-connection portions 42. The control signal line of the switch can be connected to a control end of a multiplexing unit, which will be explained below in detail. The second sub-connection portion 42 transmits a fixed voltage signal. The control signal line of the switch transmits a signal with alternating high and low levels. The second sub-connection portion 42 can function as a shielding structure. A coupling capacitance formed between the control signal line of the switch and other signal lines is shielded to ensure a stability of the signal.

Figure 10:
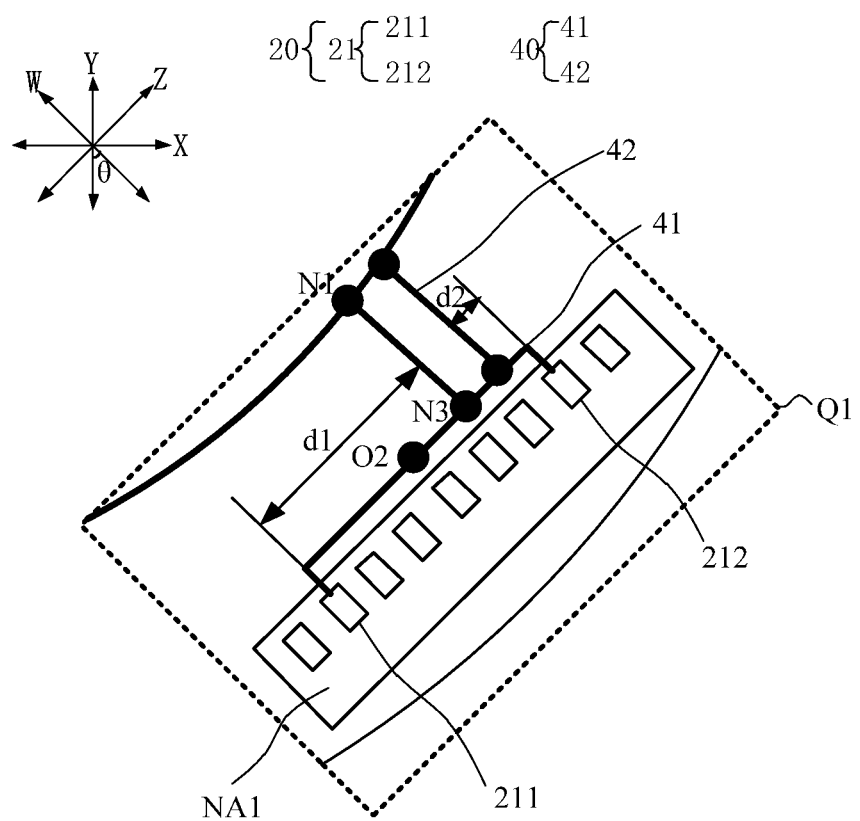
FIG. 10 illustrates an enlarged schematic diagram of a Q1 area in FIG. 9.

In some optional embodiments, to distinguish two first conductive pads 21 respectively connected to two ends of the first sub-connection portion 41, referring to FIGS. 9 and 10, one of the first conductive pads 21 is referred to as a first sub-conductive pad 211, and the other first conductive pad 21 is referred to as a second sub-conductive pad 212. Taking number of the second sub-connection portions 42 as two as an example, the two second sub-connection portions 42 are regarded as a whole. Therefore, along the third direction Z, a perpendicular distance from a center of the first sub-conductive pad 211 to a left second sub-connection portion 42 as shown in FIG. 10 is d1. A perpendicular distance from a center of the second sub-conductive pad 212 to a right second sub-connection portion 42 as shown in FIG. 10 is d2, and d1>d2. In another embodiment, number of the second sub-connection portion 42 is one, a perpendicular distance from the second sub-connection portion 42 to the center of the first sub-conductive pad 211 and a perpendicular distance from the second sub-connection portion 42 to the center of second sub-conductive pad 212 are d1 and d2. Therefore, a position of the second sub-connection portion 42 relative to the first sub-connection portion 41 can be restricted to be asymmetric, i.e., a non-central position. Taking a central point O2 of the first sub-connection portion 41 in the third direction Z for illustration, third connection nodes N3 are all disposed on a side of a center point O2 of the first sub-connection portion 41 close to one end of the first sub-connection portion 41. That is, the second sub-connection portion 42 is no longer at a center of the first sub-connection portion 41 or the second sub-connection portion 42 is no longer symmetrical about the center of the first sub-connection portion 41. The second sub-connection portion 42 is also designed with bias.

Figure 11:
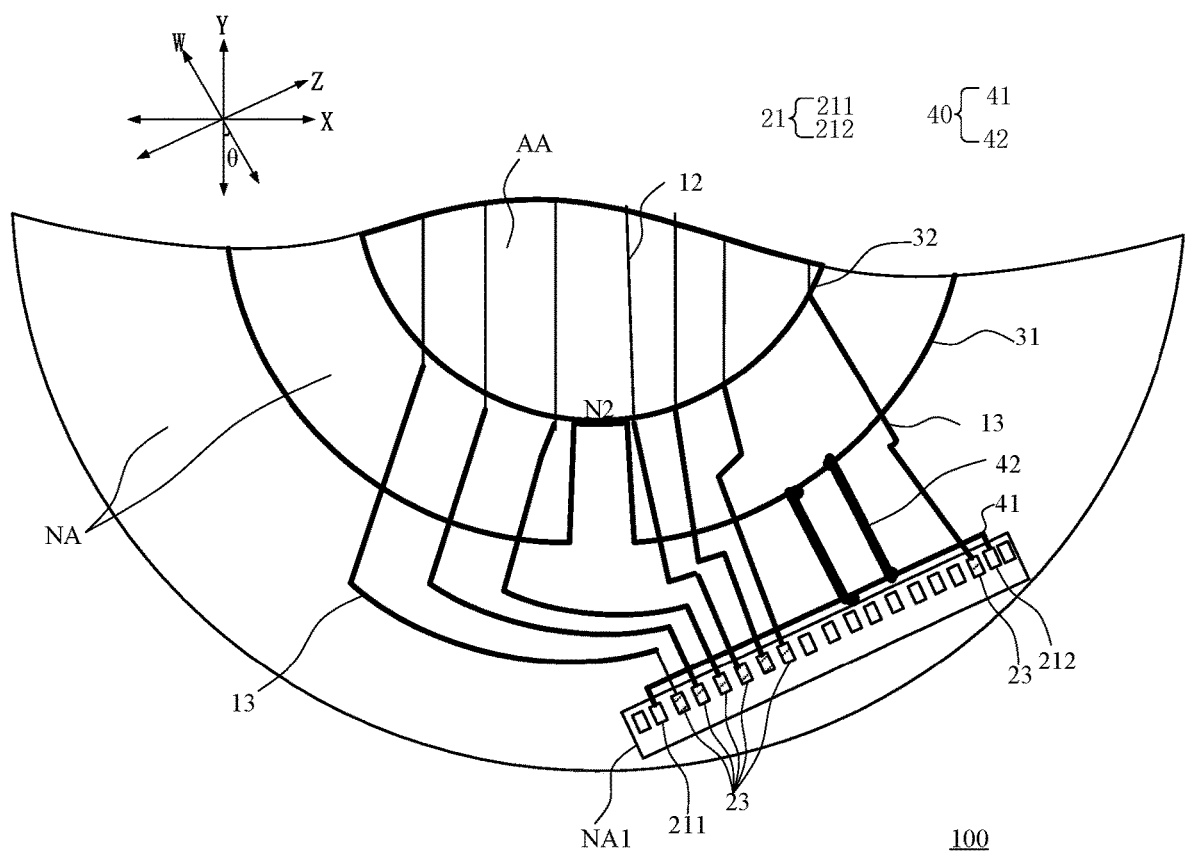
FIG. 11 illustrates a schematic diagram of a Q3 area in FIG. 9 consistent with various embodiments of the present disclosure.

Referring to FIG. 11 and FIG. 3, a fan-out wiring 13 includes a fan-out wiring portion 131 extending at least partially around the display area AA. Since some of the plurality of pads 20 need to be electrically connected to the fan-out wirings 13, as shown in FIG. 11 and FIG. 3, when the bonding area NA1 is biased to the non-display area on a right side, many fan-out wirings generally gather in an area on a left side of the bonding area. In one situation, if the second sub-connection portions 42 are disposed in a middle area of the bonding area relative to the bonding area NA1, that is, if the second sub-connection portions 42 are disposed in a middle area of the first sub-connection portion 41, i.e., in positions near the center point O2 as described above, fan-out wirings near a left side of the bonding area largely overlap the second sub-connection portions 42, but fan-out wirings at a far end of the central point O2 may not overlap the second sub-connection portion 42. Therefore, on one hand, parasitic capacitances caused by overlaps between the fan-out wirings and the second sub-connection portions affects transmissions of data signals. On another hand, overlap degrees in overlapping areas formed by the fan-out wirings and the second sub-connections are different, including number of overlaps between the fan-out wirings and the second sub-connections being different, so that signals of the fan-out wirings are not uniform due to the number of overlaps, which ultimately affects a display effect. In one embodiment, as shown in FIG. 11, since the second sub-connection portions 42 are no longer close to the center of the first sub-connection portion 41, or the second sub-connection portions 42 are no longer symmetrical about the center of the first sub-connection portion 41, overlaps between the second sub-connection portions 42 and the fan-out wirings can be avoided, which eventually leads to a same number of overlaps between the fan-out wirings and the first power bus. For example, each fan-out wiring overlaps the first power bus once. Therefore, on one hand, number of overlaps between the fan-out wirings and the first power bus is ensured to reduce to one, and an influence of coupling capacitances is minimized. On another hand, number of overlaps between the fan-out wirings and the first power bus can be ensured to be same and a uniformity of coupling capacitance of each fan-out wiring can be ensured, thereby improving a display effect.

Figure 12:
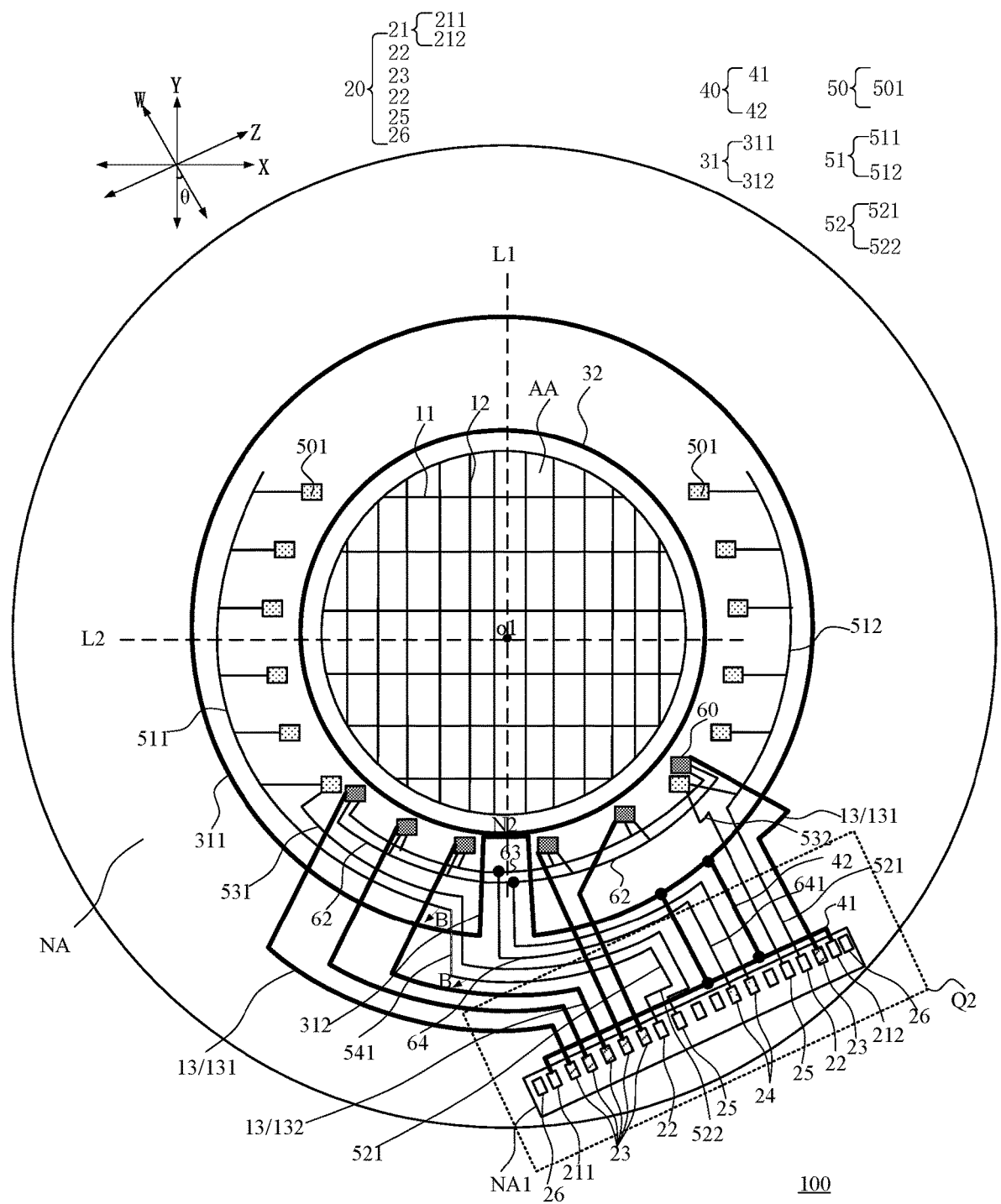
FIG. 12 illustrates a schematic diagram of a display panel provided by another embodiment of the present disclosure.
Figure 13:
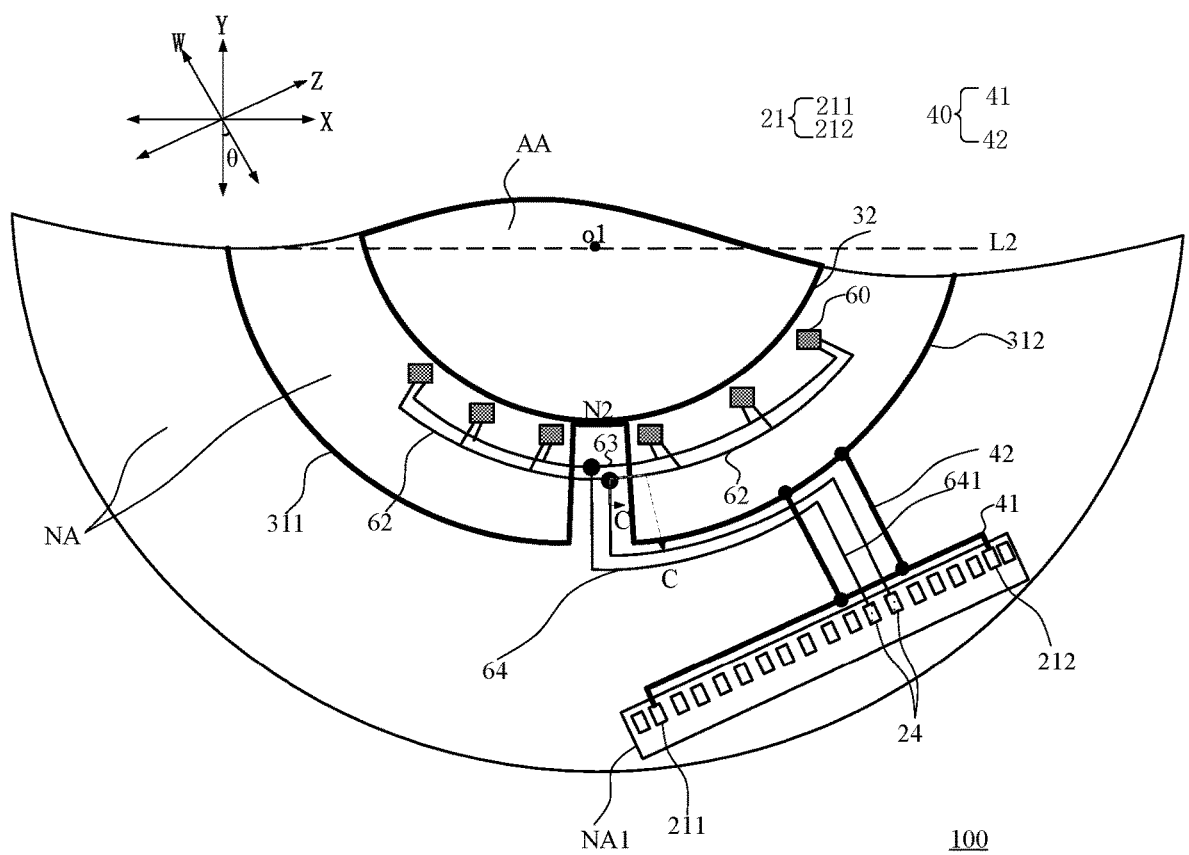
FIG. 13 illustrates another schematic diagram of a Q3 area in FIG. 9 consistent with various embodiments of the present disclosure.

In some optional embodiments, as shown in FIGS. 12 and 13, the non-display area NA further includes gate driving circuits 50 and clock signal lines 51 disposed on two sides of the display panel 100 in the first direction X. The clock signal lines 51 are disposed on a side of the first power bus 31 close to the display area AA. The clock signal lines 51 include first clock signal lines 511 and second clock signal lines 512 that respectively drive the gate driving circuits 50 on two sides. The gate driving circuits 50 may be electrically connected to the scan lines 11 for transmitting scan signals and/or light emission control signals to the scan lines 11. One gate driving circuit 50 may be disposed on each side of the display panel 100 in the first direction X. Respective numbers of the first clock signal lines 511 and the second clock signal lines 512 are not limited herein. For a clarity of the accompanying drawings, numbers of the first clock signal lines 511 and the second clock signal lines 512 in the accompanying drawings are both indicative, which are not used to limit the present disclosure.

Exemplarily, the gate driving circuits 50 may be disposed on the side of the first power bus 31 close to the display area AA. For example, the gate driving circuits 50 and the clock signal lines 51 may be disposed between the first power bus 31 and the second power bus 32. The gate driving circuits 50 may be disposed on a side of the clock signal lines 51 close to the display area AA.

Exemplarily, the gate driving circuits 50 may include a plurality of cascaded shift register units 501. The display panel 100 may further include a first trigger signal line 531 and a second trigger signal line 532 respectively driving the gate driving circuits 50 on two sides of the display panel 100. In the accompanying drawings, a reverse sweep is taken for illustration. The first trigger signal line 531 and the second trigger signal line 532 can be electrically connected to a last shift register unit 501 of the gate driving circuits 50 on two sides of the display panel 100 respectively.

As described above, the bus connection portion 40 may include at least one second sub-connection portion 42 extending along the fourth direction W. Number of second sub-connection portions 42 is taken as two for illustration herein.

Figure 14:
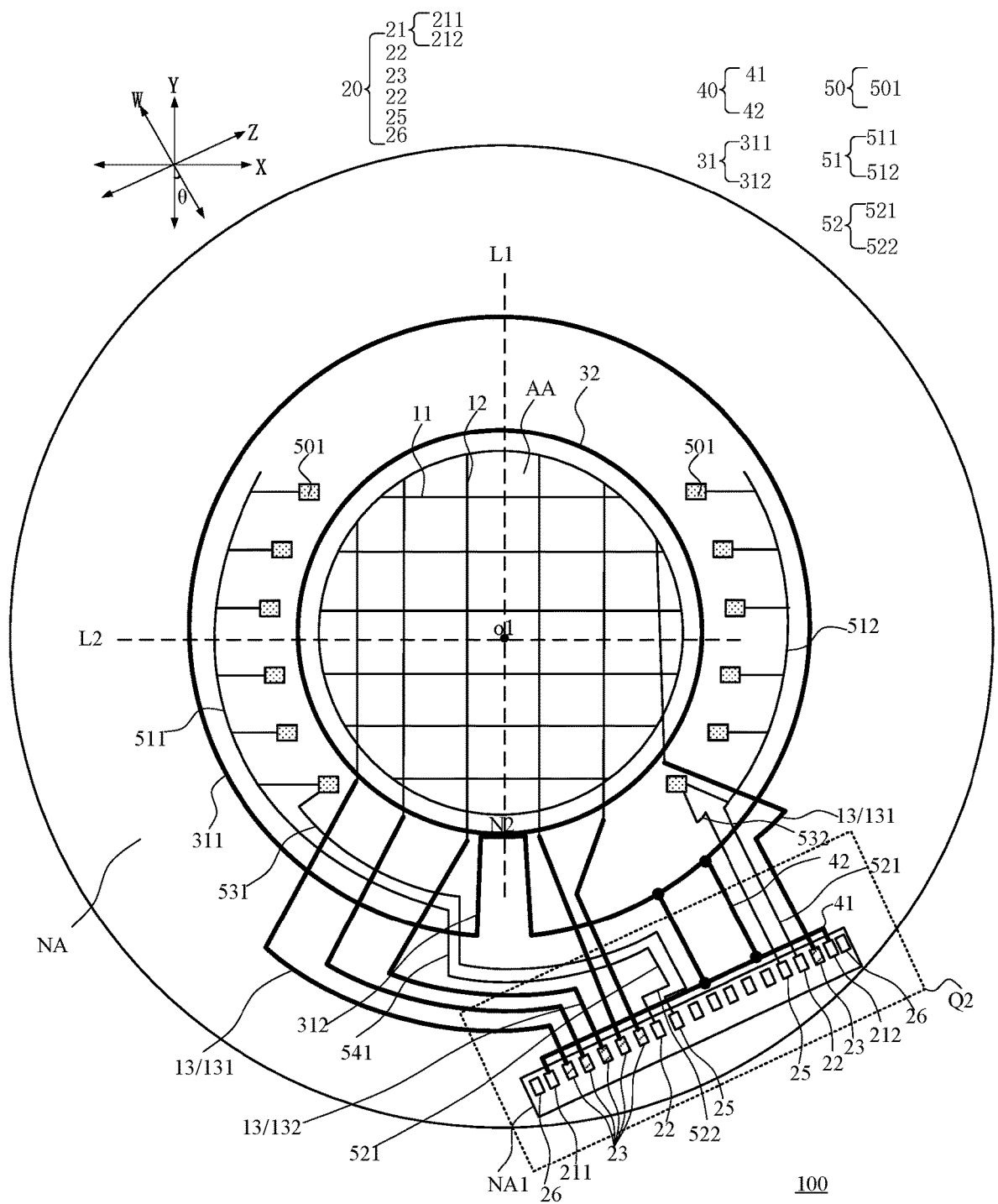
FIG. 14 illustrates a schematic diagram of a display panel provided by another embodiment of the present disclosure.

As shown in FIGS. 12 and 14, the pads 20 may also include a plurality of second conductive pads 22. The clock signal lines 51 are electrically connected to the plurality of second conductive pads 22 through clock signal connection lines 52. The clock signal connection lines 52 include first clock signal connection portions 521 extending in the fourth direction W. Since the clock signal lines 51 include first clock signal lines 511 and second clock signal lines 512. Number of the clock signal connection lines 52 may be a plurality. Some of the clock signal connection lines 52 are electrically connected to the first type of clock signal lines 511. Some of the clock signal connection lines 52 are electrically connected to the second clock signal lines 512.

The clock signal connection lines 52 may include the first clock signal connection portions 521 extending in the fourth direction W. A plurality of first clock signal connection portions 521 may be disposed on two sides of the second sub-connection portion 42 in the third direction Z. When there are two second sub-connection portions 42, there is no first clock signal connection portion 521 between the two second sub-connection portions 42.

Exemplarily, referring to FIGS. 12 and 14, the non-display area NA may further include a plurality of multiplexing units 60 and a plurality of fan-out wirings 13. The pads 20 may also include a plurality of third conductive pads 23. One end of a fan-out wiring 13 is electrically connected to an input end of a multiplexing unit 60, and another end of the fan-out wiring is electrically connected to a third conductive pad 23. An output end of the multiplexing unit 60 can be connected to a data line 12 for transmitting data signals to the data line 12. The multiplexing unit 60 may include a plurality of output ends, and each output end is connected to at least one data line 12. Compared with directly connecting the fan-out wirings 13 to the data lines 12, by providing the plurality of multiplexing units 60, number of the plurality of the fan-out wirings 13 can be reduced, thereby achieving a narrow frame. Number of the plurality of third conductive pads 23 can be reduced, and number of output pins in the driver IC can be reduced, thereby reducing a cost.

Exemplarily, referring to FIGS. 12 and 14, a fan-out wiring 13 includes a first fan-out wiring portion 131 extending along the surrounding display area AA. There may be no overlap between the first clock signal connection portions 521 and the first fan-out wiring portions 131 extending along the surrounding display area AA. Since signals on the fan-out wirings 13 and the first clock signal connection portions 521 are constantly changing within one frame time, if there are overlaps between the plurality of fan-out wirings 13 and the first clock signal connection portions 521, parasitic capacitances between the plurality of fan-out wirings 13 and the first clock signal connection portions 521 may be relatively large. A potential change of one fan-out wiring 13 and a first clock signal connection portion 521 may affect a potential change of another one fan-out wiring 13 and the first clock signal connection portion 521. The above situation can also be referred to as a signal coupling caused by a parasitic capacitance. When the first clock signal connection portions 521 do not overlap with the first fan-out wiring portions 131 extending along the surrounding display area AA, an instability of signals on the plurality of fan-out wiring 13 and/or the first clock signal connection portions 521 caused by signal couplings can be reduced. In addition, an overlap situation between each first fan-out wiring portion 131 extending around the display area AA and a first clock signal connection portion 521 is same. Therefore, each first fan-out wiring portion 131 extending along the display area AA is uniformly affected by a first clock signal connection portion 521, thereby improving a display uniformity.

Exemplarily, the pads 20 may further include fifth conductive pads 25. The first trigger signal line 531 and the second trigger signal line 532 are each electrically connected to a fifth conductive pad 25. The fifth conductive pads 25 and the second conductive pads 22 are disposed adjacent to each other. In the third direction Z, the fifth conductive pads 25 may be on a side of the second conductive pads 22 close to the second sub-connection portions 42.

Figure 15:
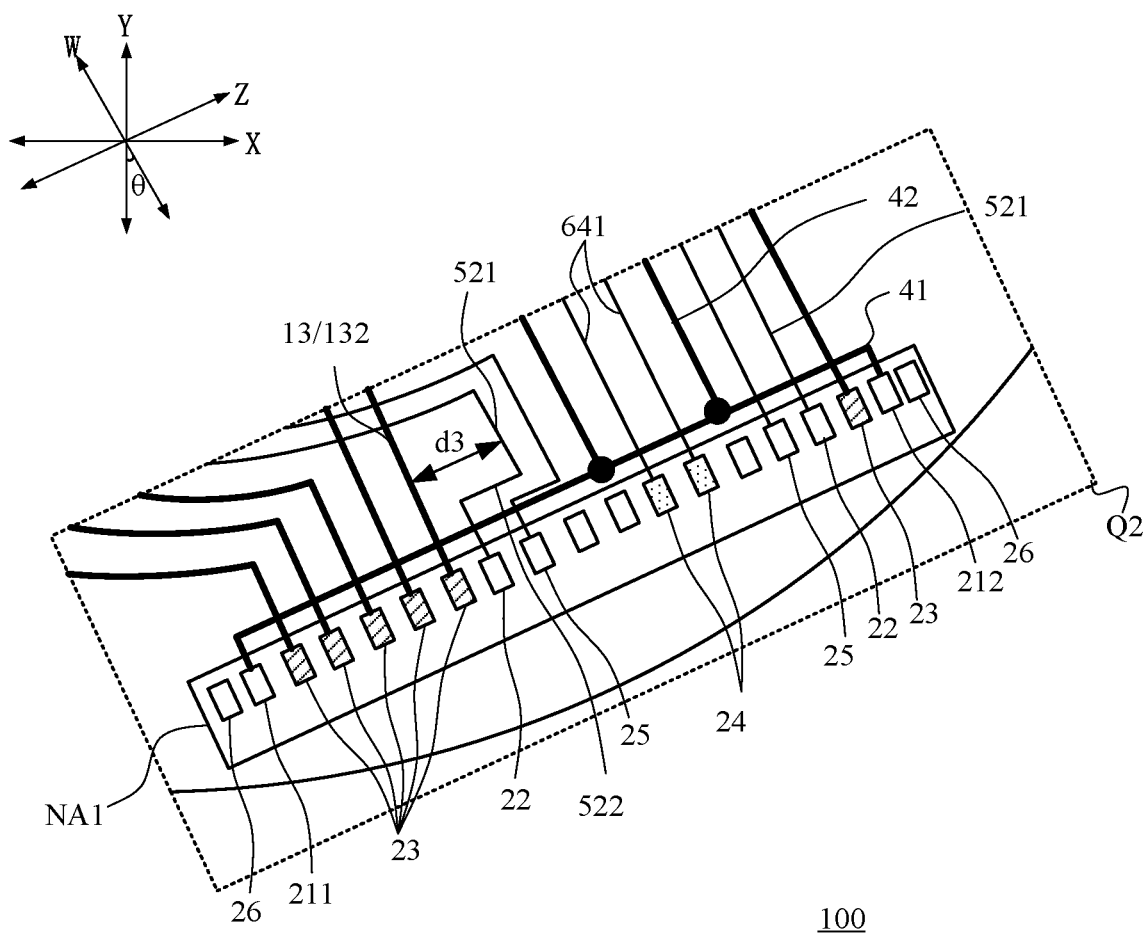
FIG. 15 illustrates an enlarged schematic diagram of a Q2 area in FIG. 12.

In some optional embodiments, referring to FIG. 12, FIG. 14, and FIG. 15, at least part of the clock signal connection lines 52 may further include second clock signal connection portions 522 extending along the third direction Z. At least part of the first clock signal connection portions 521 are electrically connected to the second conductive pads 22 through the second clock signal connection portions 522. The second clock signal connection portions 522 may be disposed on a side of the first clock signal connection portions 521 away from the second sub-connection portion 42. Exemplarily, at least part of the first clock signal connection portions 521 and the second conductive pads 22 electrically connected to the part of the first clock signal connection portions 521 are not on a same straight line.

Exemplarily, a fan-out wiring 13 may include a second fan-out wiring portion 132 extending along the fourth direction W. In the third direction Z, the first clock signal connection portions 521 may be disposed between second fan-out wiring portions 132 and the second sub-connection portions 42. Since the second clock signal connection portions 522 are disposed on a side of the first clock signal connection portions 521 away from the second sub-connection portions 42, a distance d3 between adjacent first clock signal connection portion 521 and second fan-out wiring portion 132 in the third direction Z is increased. That is, the first clock signal connection portions 521 and the second fan-out wiring portions 132 can be separated by a certain spacing. As described above, signals on the fan-out wirings 13 and the first clock signal connection portions 521 are constantly changing within one frame time. Since the distance between the first clock signal connection portion 521 and the second fan-out wiring portion 132 is increased, a signal coupling between the first clock signal connection portion 521 and the second fan-out wiring portion 132 can be reduced, and a mutual influence of signals between the first clock signal connection portion 521 and the second fan-out wiring portion 132 can be avoided.

In some optional embodiments, as shown in FIG. 14, the first clock signal lines 511 are disposed on the side of the first power bus 31 close to the display area AA. The clock signal connection lines 52 are disposed on the side of the first power bus 31 away from the display area AA. That is, the first clock signal lines 511 and the clock signal connection lines 52 are separately arranged on two sides of the first power bus 31. At least part of the first clock signal lines 511 can be connected to the clock signal connection lines 52 through first jump-leads 541. The first jump-leads 541 and the first power bus 31 overlap and are disposed in different layers.

Figure 16:
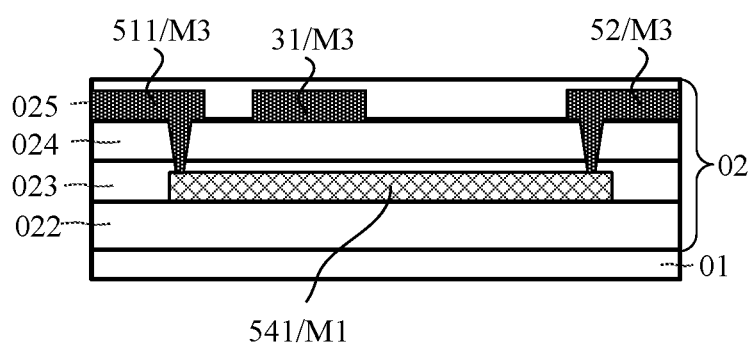
FIG. 16 illustrates a schematic diagram of a cross-section along a B-B direction in FIG. 12.

Exemplarily, the first jump-leads 541, the first clock signal lines 511, and the clock signal connection lines 52 can be disposed on different layers. The first jump-leads 541 can respectively connect the first clock signal lines 511 and the clock signal connection lines 52 through vias. For example, as shown in FIG. 16, the first jump-leads 541 may be disposed on the first metal layer M1, and the first clock signal lines 511 and the clock signal connection lines 52 may be disposed on the third metal layer M3. The first power bus 31 may also be disposed on the third metal layer M3.

In some optional embodiments, referring to FIG. 12, taking an input end of a multiplexing unit 60 connected to a third conductive pad 23 through a fan-out wiring 13, and an output end of the multiplexing unit 60 connected to a data line 12 as an example, along the third direction Z, the third conductive pad 23 may be disposed between two first conductive pads 21. Exemplarily, the two first conductive pads 21 includes a first sub-conductive pad 211 and a second sub-conductive pad 212. Along the third direction Z, the third conductive pad 23 may be disposed between the first sub-conductive pad 211 and the second sub-conductive pad 212. In the third direction Z, the first sub-conductive pad 211 and the second sub-conductive pad 212 are respectively disposed close to two edges of the bonding area NA1.

Taking the bus connection portion 40 including a first sub-connection portion 41 extending along the third direction Z, and at least one second sub-connection portion 42 extending along the fourth direction W as an example, as described above, when the bonding area NA1 is biased, the second sub-connection portion 42 is also biased and the second sub-connection portion 42 is no longer at the center of the first sub-connection portion 41 or the second sub-connection portion. 42 is no longer symmetrical about the center of the first sub-connection portion 41. Therefore, along the third direction Z, number of the plurality of third conductive pads 23 on two sides of the second sub-connection portion 42 may also be different. Exemplarily, along the third direction Z, number of the plurality of third conductive pads 23 on one side of the second sub-connection portion 42 is greater than number of the plurality of third conductive pads 23 on another side of the second sub-connection portion 42. For example, along the third direction Z, a difference between the number of the plurality of third conductive pads 23 on one side of the second sub-connection portion 42 and the number of the plurality of third conductive pads 23 on another side of the second sub-connection portion 42 is greater than or equal to two. The plurality of third conductive pads 23 is no longer symmetrically distributed relative to the second sub-connection portion 42.

For example, the first conductive pads 21 may include the first sub-conductive pad 211 and the second sub-conductive pad 212. The clock signal lines 51 are electrically connected to the second conductive pads 22. Along the third direction Z, part of the plurality of third conductive pads 23 may be located between the first sub-conductive pad 211 and one second conductive pad 22. Another part of the plurality of third conductive pads 23 may be located between the second sub-conductive pad 212 and another second conductive pad 22. There may be no third conductive pad 23 between the second conductive pads 22. Number of the plurality of third conductive pads 23 between the first sub-conductive pad 211 and the one second conductive pad 22 may be greater than number of the plurality of third conductive pads 23 between the second sub-conductive pad 212 and the another second conductive pad 22.

The second sub-connection portion 42 is no longer at the center of the first sub-connection portion 41 or the second sub-connection portion 42 is no longer symmetrical about the center of the first sub-connection portion 41. Along the third direction Z, number of the plurality of third conductive pads 23 on a side of the second sub-connection portion 42 close to the first sub-conductive pad 211 may be greater than number of the plurality of third conductive pads 23 on a side of the second sub-connection portion 42 close to the second sub-conductive pad 212. The first sub-conductive pad 211 is close to the first straight line L1, and the second sub-conductive pad 212 is away from the first straight line L1. The side of the second sub-connection portion 42 close to the first sub-conductive pad 211 can be regarded as a side of the second sub-connection portion 42 close to the first straight line L1. The side of the second sub-connection portion 42 close to the second sub-conductive pad 212 can be regarded as a side of the second sub-connection portion 42 away from the first straight line L1.

In the embodiments of the present disclosure, the plurality of third conductive pads 23 is no longer symmetrically distributed relative to the second sub-connection portion 42, so that an uneven number of overlaps between each fan-out wiring 13 and the first power bus 31 can be avoided, and each fan-out wiring 13 overlaps the first power bus 31 once, thereby improving a display uniformity.

Exemplarily, to better understand a location of a multiplexing unit 60, as shown in FIG. 12 or 13, taking a second straight line L2 and the center point O1 of the display area AA as an example, the second straight line L2 passes through the center point O1 of the display area AA and extends along the first direction X. A plurality of multiplexing units 60 may be distributed on a side of the second straight line L2 close to the bonding area NA1. Therefore, wiring lengths of signal lines between the multiplexing units 60 and the pads may be shortened. For example, a wiring length of a fan-out wiring 13 can be shortened. Exemplarily, the plurality of multiple multiplexing units 60 may also be distributed symmetrically relative to the first straight line L1.

In some optional embodiments, as shown in FIG. 14, a fan-out wiring 13 including a first fan-out wiring portion 131 is taken as an example. Exemplarily, an extending direction of the first fan-out wiring portion 131 may include a third direction Z and/or a direction surrounding the display area AA. Each first fan-out wiring portion 131 may not overlap the first power bus 31. That is, a situation where the first power bus 31 overlaps part of the first fan-out wiring portions 131 without overlapping another part of the first fan-out wiring portions 131 is avoided, thereby avoiding an uneven display due to uneven overlaps between the first power bus 31 and the first fan-out wiring portions 131. Overall, each fan-out wiring 13 may overlap the first power bus 31 once.

Exemplarily, when the first fan-out wiring portions 131 do not overlap the first power bus 31, the first fan-out wiring portions 131 may also not overlap the second sub-connection portions 42.

Figure 17:
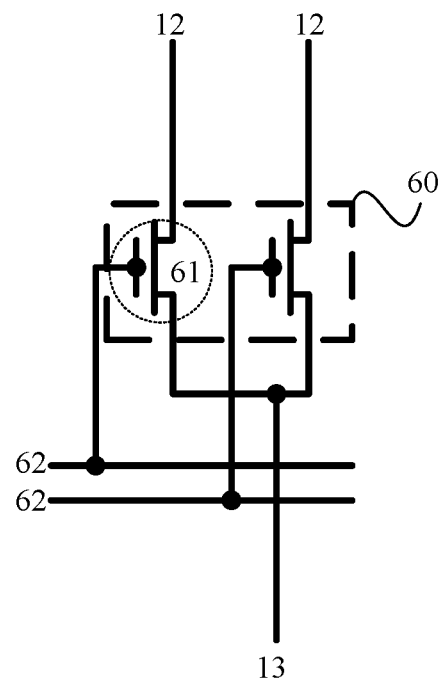
FIG. 17 illustrates a schematic diagram of a multiplexing unit provided by an embodiment of the present disclosure.

In some optional embodiments, as shown in FIG. 17, a multiplexing unit 60 may include a plurality of switches 61. For example, number of switches 61 included in the multiplexing unit 60 may be 2, 3, 4, 6, 12, etc. In the accompanying drawings of the present disclosure, number of switches 61 included in the multiplexing unit 60 is taken as 2, which is not intended to limit the present disclosure. Exemplarily, a switch 61 may be a thin film transistor such as a low-temperature polysilicon transistor or an oxide transistor. A control end of the switch 61 is connected to a control signal line 62. An input end of the switch 61 can be electrically connected to a fan-out wiring 13. An output end of the switch 61 can be electrically connected to a data line 12.

As shown in FIG. 13, control signal lines 62 may extend around the display area AA. For example, the control signal lines 62 may be on the side of the first power bus 31 close to the display area AA. The control signal lines 62 can be switched at the second connection node N2. Exemplarily, the display panel 100 may include a wire change connection line 63. As described above, the first power bus 31 may include a first subsection 311 and a second subsection 312 connected to each other. The second subsection 312 is connected between the first subsection and the second connection node N2. The wire change connection line 63 may extend in a direction surrounding the display area AA. The wire change connection line 63 overlaps the second subsection 312. The wire change connection line 63 is connected between the control signal lines 62. The display panel may further include control signal connection lines 64 on the side of the first power bus 31 away from the display area AA. One end of a control signal connection line 64 is connected to the wire change connection line 63, and another end of the control signal connection line 64 is connected to a fourth conductive pad 24.

Figure 18:
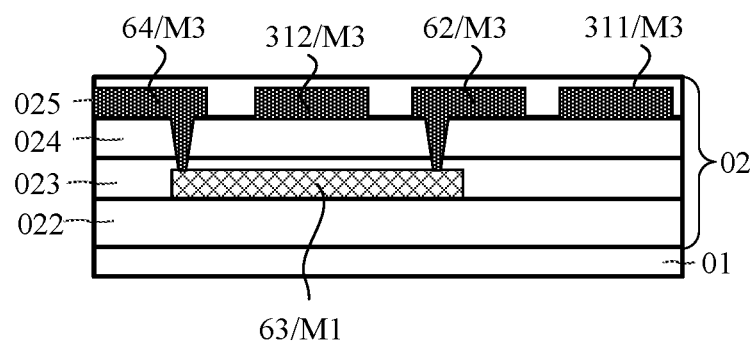
FIG. 18 illustrates a schematic diagram of a cross-section along a C-C direction in FIG. 13.

Exemplarily, the control signal connection lines 64, the first subsection 311, and the second subsection 322 may be disposed on the same film layer. The wire change connecting line 63 and the second subsection 322 are disposed on different film layers. For example, as shown in FIG. 18, the control signal connection lines 64, the first subsection 311, and the second subsection 322 may be disposed on the third metal layer M3, and the switching connection line 63 may be disposed on the first metal layer M1. The control signal lines 62 may also be disposed on the third metal layer M3. The wire change connection line 63 is connected to the control signal wires 62 on two sides of a via hole through the via hole. The wire change connection line 63 is connected to the control signal connecting line 64 through the via hole.

Exemplarily, a control signal connection line 64 may include a control signal connection portion 641 extending along the fourth direction W. The control signal connection portion 641 is connected to the fourth conductive pad 24. The control signal connection portion 641 may be located between adjacent second sub-connection portions 42. Signals on the clock signal connection lines 52 on two sides of the control signal connection portion 641 and two sides of the second sub-connection portion 42 change continuously within a frame time. The second sub-connection portion 42 transmits fixed voltage signals, so the second sub-connection portion 42 can function as a shielding structure. Coupling capacitances formed between the control signal connection portion 641 and the clock signal connection lines 52 are shielded to ensure a signal stability.

Exemplarily, in the third direction Z, fourth conductive pads 24 may be disposed between the fifth conductive pads 25. In addition, the pads 20 may further include sixth conductive pads 26 for transmitting negative voltage signals to the display area AA. For example, a sixth conductive pad 26 may be electrically connected to a cathode of a light emitting element in the display area AA. The sixth conductive pads 26 may be disposed adjacent to the first conductive pads 21. For example, in the third direction Z, a sixth conductive pad 26 may be on a side of a first conductive pad 21 away from the second sub-connection portion 42.

Exemplarily, referring to FIG. 12 and FIG. 7, when the display panel 100 includes the first metal layer M1, the second metal layer M2, and the third metal layer M3 that are stacked, the control signal connection portion 641, the first clock signal connection portions 521 and the second clock signal connection portions 522 may be disposed on the first metal layer M1. The first sub-connection portion 41 and the second sub-connection portions 42 may be disposed on the third metal layer M3.

Figure 19:
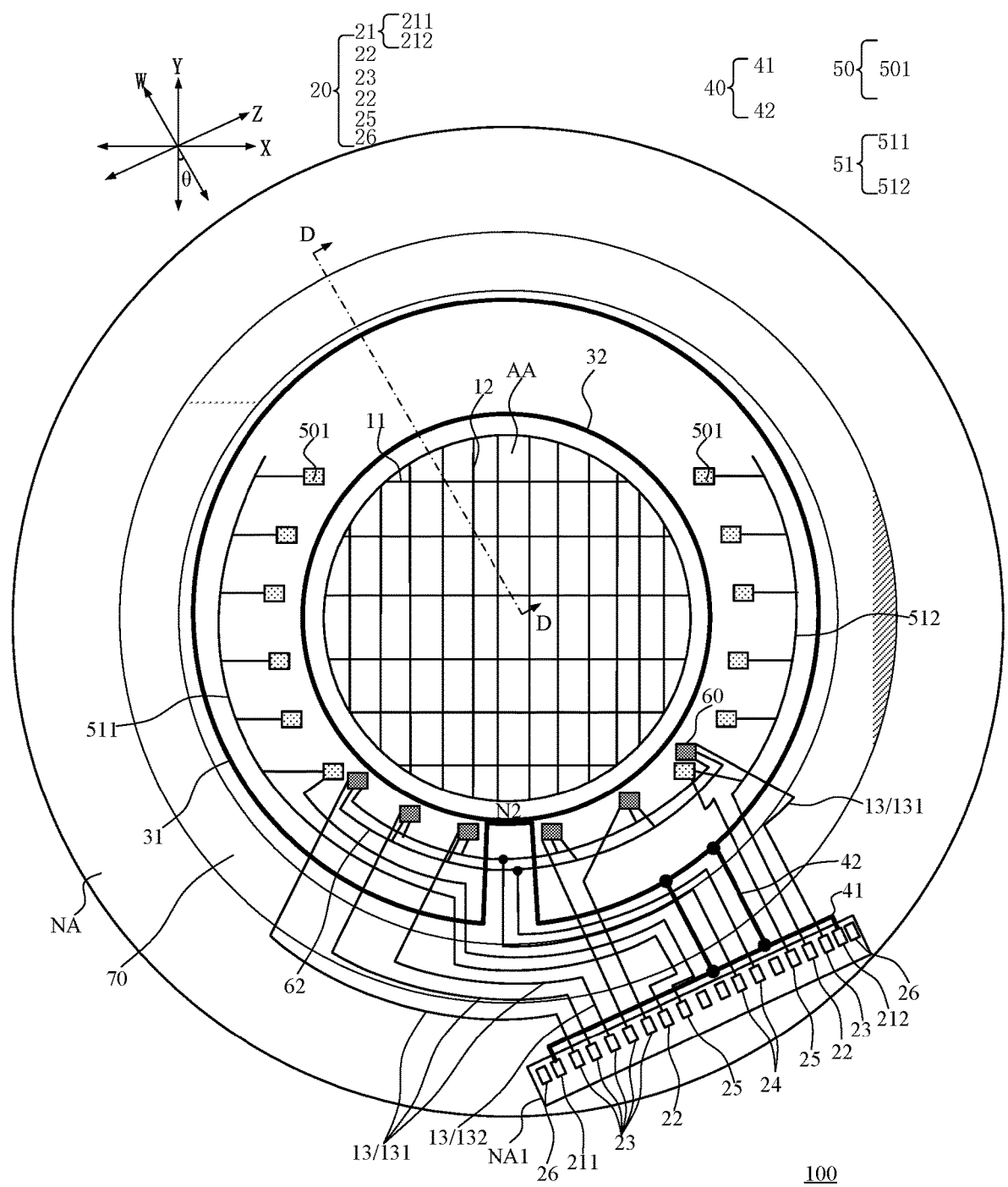
FIG. 19 illustrates a schematic diagram of a display panel provided by another embodiment of the present disclosure.

In some optional embodiments, as shown in FIG. 19, the display panel 100 may further include an encapsulation structure 70 disposed between the display area AA and the bonding area NA1. Taking the bus connection portion 40 including a first sub-connection portion 41 extending along the third direction Z and at least one second sub-connection portion 42 extending along the fourth direction W as an example, in a direction perpendicular to the plane where the display panel 100 is located, a first fan-out wiring portion 131 close to the at least one second sub-connection portion 42 overlaps the encapsulation structure 70.

The first fan-out wiring portions 131 extend in a direction surrounding the display area AA. A plurality of first fan-out wiring portions 131 are sequentially disposed in a direction away from the display area AA. A first fan-out wiring portion 131 close to the second sub-connection portion 42 is a first fan-out wiring portion 131 close to the display area AA in a direction of an edge of the display panel pointing to the display area AA. The first fan-out wiring portion 131 close to the display area AA overlaps the encapsulation structure 70.

To better understand a location of the first fan-out wiring portion 131 that overlaps the encapsulation structure 70, a fan-out wiring 13 further including the second fan-out wiring portion 132 extending along the fourth direction W is taken as an example. Part of the second fan-out wiring portions 132 are connected to the plurality of first fan-out wiring portions 131. A first fan-out wiring portion 131 close to the second sub-connection portion 42 is a first fan-out wiring portion connected to the second fan-out wiring portion 132 close to the second sub-connection portion 42 in the third direction Z. In the third direction Z, the first fan-out wiring portion 131 connected to the second fan-out wiring portion 132 close to the second sub-connection portion 42 overlaps the encapsulation structure 70.

Compared with the encapsulation structure 70 on a side of a first fan-out wiring portion 131 away from the display area AA, in the embodiments of the present application, since the first fan-out wiring portion 131 close to the second sub-connection portion 42 overlaps the encapsulation structure 70, the encapsulation structure 70 is equivalent to moving toward the display area AA, thereby reducing a size of the non-display area AA to realize a narrow frame.

Figure 20:
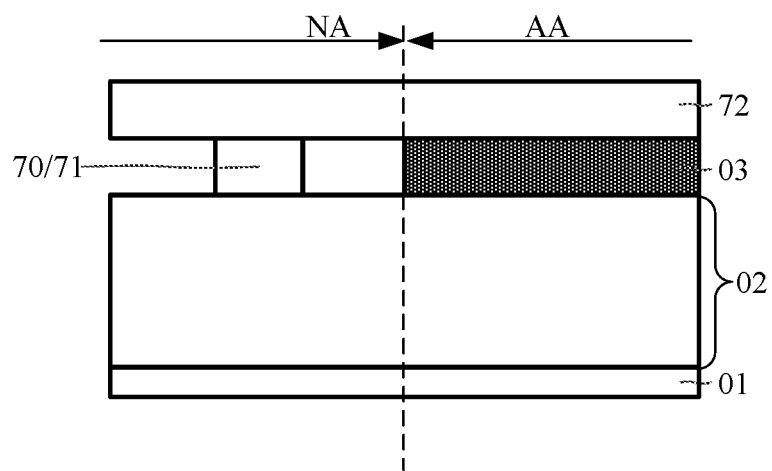
FIG. 20 illustrates a schematic diagram of a cross-section along a D-D direction in FIG. 19.

In some optional embodiments, referring to FIGS. 19 and 20, the encapsulation structure 70 may include an encapsulation adhesive 71. In the direction perpendicular to the plane where the display panel is located, the encapsulation adhesive 71 does not overlap the display area AA. Exemplarily, a material of the encapsulation adhesive 71 may include Frit. The display panel may also include an encapsulation cover 72 and a light emitting layer 03 in the display area AA. The light emitting layer 03 is disposed on a side of the driving device layer 02 away from the substrate 01. The encapsulation cover 72 is on a side of the light emitting layer 03 away from the substrate 01. The encapsulation cover 72 extends to the non-display area NA. The encapsulation adhesive 71 may be connected between encapsulation cover 72 and the driving device layer 02. Exemplarily, the encapsulation cover 72 may be a glass cover, and the light emitting layer 03 may be a light emitting layer with organic light emitting diodes. In addition, to clearly show an overall structure of the display panel, the first power bus, the second power bus, the scan lines, the data lines are drawn in a hidden manner in FIG. 20.

The encapsulation adhesive 71 is generally opaque. In one embodiment, by setting the encapsulation adhesive 71 and the display area AA not to overlap, the encapsulation adhesive 71 can be prevented from reducing a screen-to-body ratio of the display panel.

Exemplarily, in a process of forming the encapsulation adhesive 71, a process such as laser process may be applied to prevent transistors and other components of the display panel from being burned in the process. The encapsulation adhesive 71 can be disposed on a side of the gate driving circuits 50 away from the display area AA. There is a certain spacing between encapsulation adhesive 71 and the gate driving circuits 50.

Figure 21:
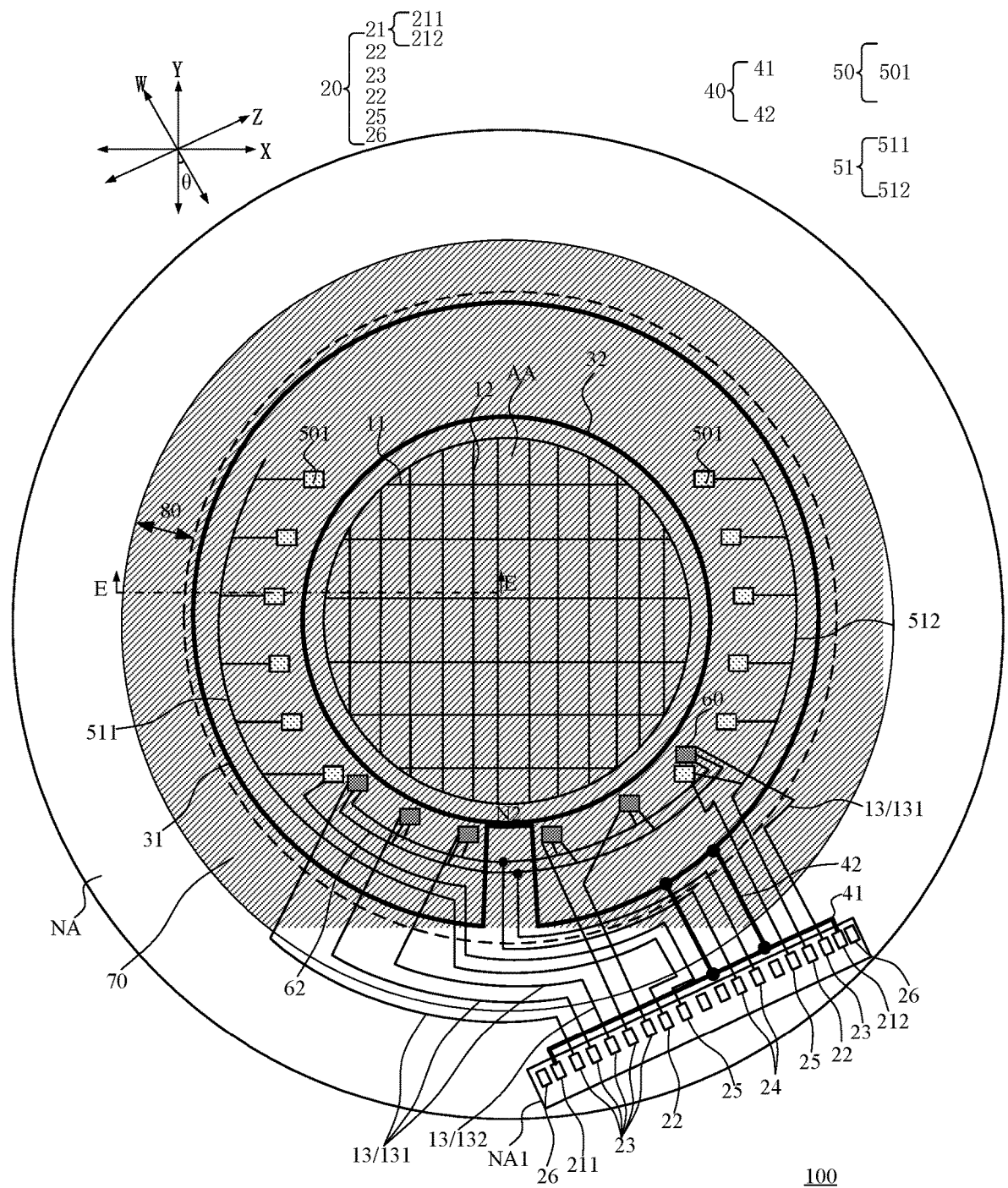
FIG. 21 illustrates a schematic diagram of a display panel provided by another embodiment of the present disclosure.

In the embodiments of the present disclosure, since the bonding area NA1 is biased by a certain angle, and the second sub-connection portion 42 connected to the first power bus 31 is no longer at the center of the first sub-connection portion 41 or is no longer symmetrical about the center of the first sub-connection portion 41, the fan-out wirings 13 on one side of the second sub-connection portion 42 in the third direction Z are more than the fan-out wirings 13 on another side of the second sub-connection portion 42 in the third direction Z. Due to a larger number of fan-out wirings 13 on the one side, the one side may occupy a wider non-display area. There should be a certain spacing between the encapsulation adhesive 71 and the gate drive circuits 50. If the encapsulation adhesive 71 is disposed on a side of the fan-out wiring portions 131 of the plurality of fan-out wirings 13 away from the display area, a width of the non-display area may become larger, that is, the display panel may have a larger frame. In one embodiment, the encapsulation adhesive 71 is no longer limited to be disposed on the side of the fan-out wiring portions 131 of the plurality of fan-out wiring 13 away from the display area. The encapsulation adhesive 71 is disposed to overlap the fan-out wiring portions 131 and is disposed on a side opposite to the side of the fan-out wiring portion 131 of the fan-out wiring 13 away from the display area, which is equivalent to the encapsulation adhesive 71 moving toward the display area AA, thereby facilitating to realize a narrow frame. In some optional embodiments, referring to FIGS. 21 and 22, the display panel includes an encapsulation film 73 covering the display area AA and extending to an organic clearance area 80 of the non-display area NA. The encapsulation structure 70 includes barrier members 74 disposed in the organic clearance area 80. In addition, the encapsulation structure also includes the encapsulation film. The barrier members and the encapsulation film jointly protect the display light emitting device and prevent an intrusion of water and oxygen.

Figure 22:
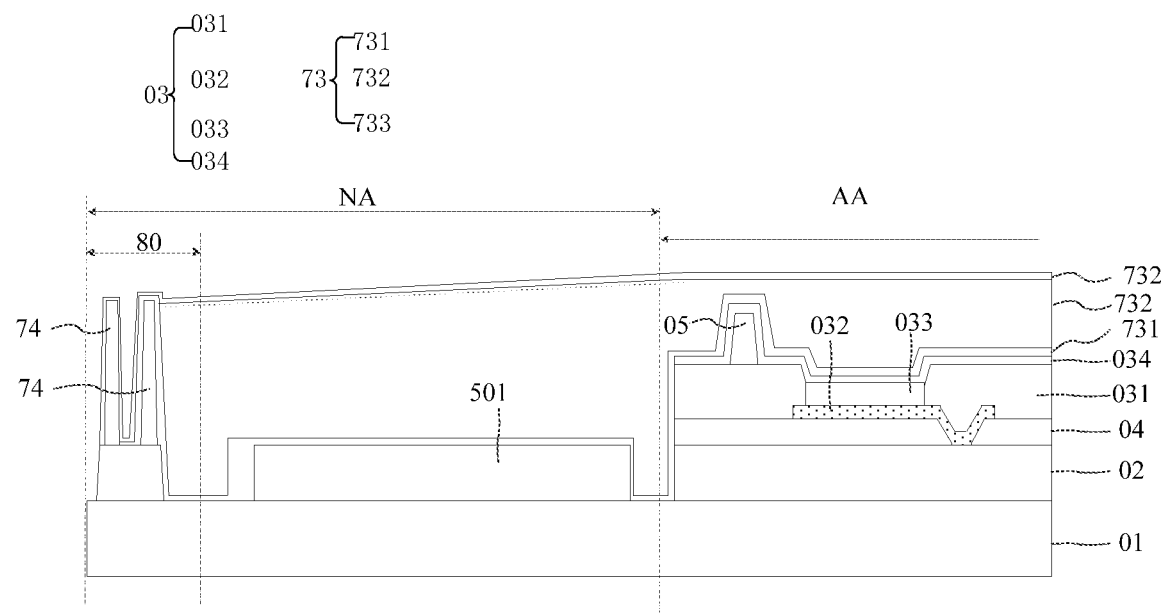
FIG. 22 illustrates a schematic diagram of a cross-section along a E-E direction in FIG. 21.

Exemplarily, the display area AA of the display panel may include a light emitting layer 03 disposed on a side of the driving device layer 02 away from the substrate 01. The encapsulation film 73 is on the side of the light emitting layer 03 away from the substrate 01. The encapsulation film 73 may include multilayered inorganic and organic layers to prevent water and oxygen from intruding into the light emitting layer 03. In FIG. 22, the encapsulation film 73 including a first inorganic layer 731, an organic layer 732, and a second inorganic layer 733 that are sequentially stacked in a direction away from the substrate 01 is taken as an example. Exemplarily, inorganic layers of the encapsulation film 73 can be formed by means of chemical vapor deposition (CVD), and the organic layer of the encapsulation film 73 can be formed by means of ink jet printing (IJP). Since materials of the organic layer may flow in a process of forming the organic layer, the barrier members 74 can prevent the materials of the organic layer from flowing out of the display panel.

A barrier member 74 is a circular blocking wall surrounding the display area AA. To better prevent the materials of the organic layer from flowing out of the display panel, two or more barrier members 74 may be disposed. In one embodiment, two barrier members 74 are taken for illustration, which is not used to limit the present disclosure.

Exemplarily, the first fan-out wiring portion 131 close to the second sub-connection portion 42 may be in the organic clearance area 80. Similarly, first fan-out wiring portions 131 extend in a direction surrounding the display area AA. A plurality of first fan-out wiring portions 131 are sequentially disposed in a direction away from the display area AA. The first fan-out wiring portion 131 close to the second sub-connection portion 42 is a first fan-out wiring portion 131 close to the display area AA in the direction of an edge of the display panel pointing to the display area AA. Therefore, in the direction of the edge of the display panel pointing to the display area AA, the first fan-out wiring portion 131 close to the display area AA is in the organic clearance area 80.

To better understand a location of the first fan-out wiring portion 131 in the organic clearance area 80, the fan-out wiring 13 further including the second fan-out wiring portion 132 extending along the fourth direction W is taken as an example. Part of the second fan-out wiring portions 132 are connected to the plurality of first fan-out wiring portions 131. The first fan-out wiring portion 131 close to the second sub-connection portion 42 is a first fan-out wiring portion 131 connected to the second fan-out wiring portion 132 close to the second sub-connection portion 42 in the third direction Z. Therefore, the first fan-out wiring portion 131 connected to the second fan-out wiring portion 132 close to the second sub-connection portion 42 in the third direction Z is in the organic clearance area 80.

Compared with the organic clearance area 80 on the side of the first fan-out wiring portion 131 away from the display area AA, in one embodiment, since the first fan-out wiring portion 131 close to the second sub-connection portion 42 is in the organic clearance area 80, that is, the first fan-out wiring portion 131 close to the second sub-connection portion 42 overlaps the organic clearance area. The organic clearance area 80 is equivalent to moving toward the display area AA, so that a size of the non-display area AA can be reduced to realize a narrow frame. Since the organic clearance area 80 moves in a direction toward the display area AA, the barrier members 74 disposed in the organic clearance area 80 also move in the direction toward the display area AA, so that a size of the non-display area NA can be further reduced to realize a narrow frame.

Exemplarily, the organic clearance area 80 may be disposed on the side of the gate driving circuits 50 away from the display area AA. There is a certain spacing between the organic clearance area 80 and the gate driving circuits 50.

Similarly, in one embodiment, since the second sub-connection portion 42 biased by a certain angle and connected to the first power bus 31 is no longer at the center of the first sub-connection portion 41 or is no longer symmetrical about the center of the first sub-connection portion 41, fan-out wirings 13 on one side of the second sub-connection portion 42 in the third direction Z are more than fan-out wirings 13 on another side of the second sub-connection portion 42 in the third direction Z. Due to relatively large number of fan-out wirings 13 on the one side, the one side may occupy a relatively wide non-display area. There should be a certain spacing between the organic clearance area 80 and the gate driving circuits 50. If the organic clearance area 80 is still disposed on the side of the fan-out wiring portion 131 of the fan-out wiring 13 away from the display area, a width of the non-display area may become larger, that is, the display panel may have a larger frame. In one embodiment, the organic clearance area 80 is no longer limited to be disposed on the side of the fan-out wiring portion 131 of the fan-out wiring 13 away from the display area. The organic clearance area 80 is disposed to overlap the fan-out wiring portions 131 and is disposed on a side opposite to the side of the fan-out wiring portion 131 of the fan-out wiring 13 away from the display area, which is equivalent to moving the organic clearance area 80 toward the display area, thereby facilitating to realize a narrow frame.

Exemplarily, FIG. 22 also shows a planarization layer 04 located between the light emitting layer 03 and the driving device layer 02. The light emitting layer 03 may include a pixel definition layer 031 and a light emitting element. The light emitting element may include a first electrode 032, a luminous layer 033, and a second electrode 034 that are stacked. The pixel definition layer 031 has an opening exposing the first electrode 032 of the light emitting element. The luminous layer 033 is disposed in the opening of the pixel definition layer 031. The second electrode 034 may be a surface electrode. In addition, the display panel may further include a supporting column 05, which does not overlap the opening of the pixel definition layer 031 and is on a side of the pixel definition layer 031 away from the substrate 01. The shift register units 501 of the gate driving circuits 50 may be disposed in the driving device layer 02.

It should be noted that, if there is no contradiction, the embodiments provided in the present disclosure can be combined with each other.

Figure 23:
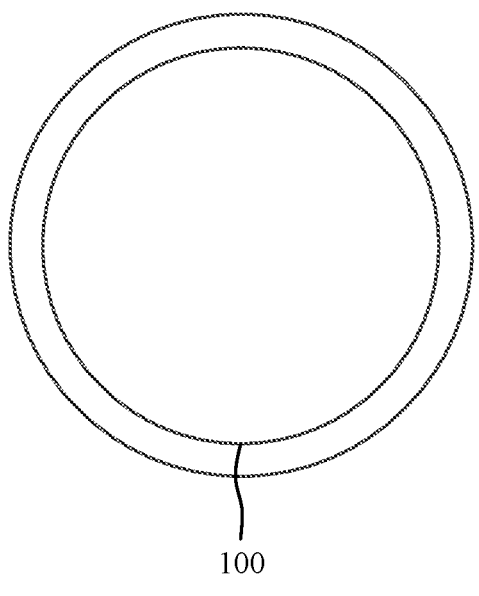
FIG. 23 illustrates a schematic diagram of a display device provided by an embodiment of the present disclosure.

The application also provides a display device, including the display panel provided in the present disclosure. FIG. 23 illustrates a schematic diagram of a display device consistent with various embodiments of the present disclosure. The display device 1000 provided in FIG. 23 includes the display panel 100 provided in any of the above embodiments of the present disclosure. FIG. 23 only uses a wearable product as an example to illustrate the display device 1000. The display device may be a display device with a display function such as a mobile phone, a computer, a television, a vehicle-mounted display device, etc., which is not specifically limited herein. The display device provided by the embodiments of the present disclosure has the beneficial effects of the display panel provided by the embodiments of the present disclosure. Details can be referred to specific descriptions of the display panel in the above embodiments, which is not repeated herein.

According to the display panel and the display device provided by the embodiments of the present disclosure, by disposing the bonding area away from the lower or upper frame of the display panel, the space of the lower or upper frame of the display panel can be saved, thereby satisfying a user's need for space restrictions on the lower frame. In addition, other functional modules can be disposed at the lower or upper frame to meet diverse needs of users.

According to the above embodiments of the present disclosure, the embodiments do not describe all the details, nor do the embodiments limit the present disclosure to only the specific embodiments described above. Apparently, many modifications and changes can be made based on the above descriptions. The present specification selects and specifically describes the embodiments to better explain principles and practical applications of the present disclosure, so that a person skilled in the art can make a good use of the present disclosure and make modifications based on the present disclosure. The present disclosure is only limited by the claims and the full scope and equivalents thereof.

What is claimed is:

1. A display panel, comprising a display area and a non-display area surrounding the display area, wherein:
the display area comprises a plurality of scan lines extending in a first direction and a plurality of data lines extending in a second direction, the first direction intersects the second direction; and
the non-display area comprises a bonding area, the bonding area comprises a plurality of pads arranged in a third direction, a direction perpendicular to the third direction is a fourth direction, an angle formed by the second direction and the fourth direction is θ, and 0°<θ<90°.

2. The display panel according to claim 1, wherein 0°<θ≤45°.

3. The display panel according to claim 1, wherein the non-display area comprises a first power bus at least partially surrounding the display area, the plurality of pads comprises at least one first conductive pad, the first power bus comprises a first connection node, and the first power bus is connected to the at least one first conductive pad at the first connection node through a bus connection portion.

4. The display panel according to claim 3, wherein:
the non-display area further comprises a second power bus at least partially surrounding the display area, the second power bus is located between the first power bus and the display area, and the second power bus is electrically connected to the first power bus; and
the display area comprises voltage signal transmission lines extending along the second direction, and the second power bus is electrically connected to at least part of the voltage signal transmission lines and transmits voltage signals to the display area.

5. The display panel according to claim 4, wherein:
the first power bus further comprises a second connection node, and the first power bus is electrically connected to the second power bus at the second connection node; and
the first connection node and the second connection node are different, and the second connection node is on a side of the first power bus close to the bonding area along the second direction.

6. The display panel according to claim 5, wherein the first power bus is recessed toward the display area at the second connection node.

7. The display panel according to claim 3, wherein:
the bus connection portion comprises a first sub-connection portion extending along the third direction and at least one second sub-connection portion extending along the fourth direction;
two ends of the first sub-connection portion are respectively connected to the at least one first conductive pad; and
one end of the second sub-connection portion is connected to a third connection node between the two ends of the first sub-connection portion, and another end of the second sub-connection portion is connected to the first connection node.

8. The display panel according to claim 7, wherein the at least one first conductive pad connected to the two ends of the first sub-connection portion comprises a first sub-conductive pad and a second sub-conductive pad, and along the third direction, a perpendicular distance from a center of the first sub-conductive pad to the second sub-connection portion is greater than a perpendicular distance from a center of the second sub-conductive pad to the second sub-connection portion.

9. The display panel according to claim 3, wherein:
the non-display area further comprises gate driving circuits and clock signal lines disposed on two sides of the display panel, the clock signal lines are disposed on a side of the first power bus close to the display area, the clock signal lines comprise first clock signal lines and second clock signal lines that respectively drive the gate driving circuits on the two sides of the display panel, and the bus connection portion comprises at least one second sub-connection portion extending along the fourth direction; and
the plurality of pads further comprises a plurality of second conductive pads, the clock signal lines are electrically connected to the plurality of second conductive pads through clock signal connection lines, the clock signal connection lines comprise first clock signal connection portions extending along the fourth direction, and the first clock signal connection portions are disposed on two sides of the second sub-connection portion.

10. The display panel according to claim 9, wherein:
at least part of the first clock signal connection portions is electrically connected to the second conductive pads through second clock signal connection portions extending along the third direction; and the second clock signal connection portions are disposed on a side of the first clock signal connection portions away from the second sub-connection portion.

11. The display panel according to claim 9, wherein:
at least part of the first clock signal lines is connected to the clock signal connection lines through a first jump-lead; and
the first jump-lead and the first power bus are overlapped and disposed in different layers, and the clock signal connection lines are disposed on a side of the first power bus away from the display area.

12. The display panel according to claim 3, wherein:
the non-display area further comprises a plurality of multiplexing units and a plurality of fan-out wirings, the plurality of pads comprises a plurality of third conductive pads;
an input end of a multiplexing unit of the plurality of multiplexing units is connected to a third conductive pad of the plurality of third conductive pads through a fan-out wiring of the plurality of fan-out wirings, and an output end of the multiplexing unit of the plurality of multiplexing units is connected to a data line of the plurality of data lines; and
along the third direction, the plurality of third conductive pads is disposed between two first conductive pads.

13. The display panel according to claim 12, wherein:
the bus connection portion comprises a first sub-connection portion extending along the third direction and at least one second sub-connection portion extending along the fourth direction; and
along the third direction, number of the third conductive pads on one side of the second sub-connection portion is greater than number of the third conductive pads on another side of the second sub-connection portion.

14. The display panel according to claim 12, wherein the plurality of fan-out wirings comprises first fan-out wiring portions, and the first fan-out wiring portions do not overlap the first power bus.

15. The display panel according to claim 12, further comprising an encapsulation structure disposed between the display area and the bonding area, wherein:
the bus connection portion comprises a first sub-connection portion extending along the third direction and at least one second sub-connection portion extending along the fourth direction; and
in a direction perpendicular to a plane where the display panel is located, the first fan-out wiring portions close to the second sub-connection portion overlap the encapsulation structure.

16. The display panel according to claim 15, wherein the encapsulation structure comprises an encapsulation adhesive, and the encapsulation adhesive does not overlap the display area.

17. The display panel according to claim 15, further comprising an encapsulation film, wherein the encapsulation film covers the display area and extends to an organic clearance area of the non-display area, and the encapsulation structure comprises barrier members disposed in the organic clearance area.

18. The display panel according to claim 12, wherein:
the plurality of pads comprises a plurality of fourth conductive pads, the multiplexing unit of the plurality of multiplexing units comprises a plurality of switches and a plurality of control signal lines for controlling the plurality of switches, and the plurality of control signal lines is switched at the second connection node and is connected to the plurality of fourth conductive pads through a plurality of control signal connection lines; and
the plurality of control signal lines is disposed on a side of the first power bus close to the display area, and the plurality of control signal connection lines is disposed on the side of the first power bus away from the display area.

19. The display panel according to claim 1, wherein a shape of the display area comprises a circle.

20. A display device, comprising a display panel comprising a display area and a non-display area surrounding the display area, wherein:
the display area comprises a plurality of scan lines extending in a first direction and a plurality of data lines extending in a second direction, the first direction intersects the second direction; and
the non-display area comprises a bonding area, the bonding area comprises a plurality of pads arranged in a third direction, a direction perpendicular to the third direction is a fourth direction, and an angle formed by the second direction and the fourth direction is $\theta$, and $0°<\theta<90°$.

* * * * *